(12) United States Patent
Taylor et al.

(10) Patent No.: US 9,391,593 B2
(45) Date of Patent: Jul. 12, 2016

(54) CIRCUIT FOR GENERATING A VOLTAGE WAVEFORM

(71) Applicant: SHIMADZU CORPORATION, Kyoto-shi, Kyoto (JP)

(72) Inventors: Steven Douglas Taylor, Manchester (GB); Matthew Clive Gill, Manchester (GB); Li Ding, Manchester (GB); James Edward Nuttall, Manchester (GB)

(73) Assignee: SHIMADZU CORPORATION, Kyoto (JP)

( * ) Notice: Subject to any disclaimer, the term of this patent is extended or adjusted under 35 U.S.C. 154(b) by 0 days.

(21) Appl. No.: 14/268,474

(22) Filed: May 2, 2014

(65) Prior Publication Data

US 2014/0347104 A1   Nov. 27, 2014

(30) Foreign Application Priority Data

May 23, 2013   (GB) .................................. 1309282.0

(51) Int. Cl.
*H03K 17/00* (2006.01)
*H03K 3/012* (2006.01)
(Continued)

(52) U.S. Cl.
CPC .............. *H03K 3/012* (2013.01); *H01J 49/022* (2013.01); *H02M 7/537* (2013.01); *H03K 3/356* (2013.01); *H03K 5/00006* (2013.01); *H03K 17/6874* (2013.01); *H02M 2007/4815* (2013.01); *Y02B 70/1441* (2013.01)

(58) Field of Classification Search
CPC ...................................................... H03K 3/012

USPC ........................................................... 327/124
See application file for complete search history.

(56) References Cited

U.S. PATENT DOCUMENTS

| 2,939,952 | A | 6/1960 | Paul et al. |
| 5,081,400 | A | 1/1992 | Weber et al. |

(Continued)

FOREIGN PATENT DOCUMENTS

| CN | 1432982 | 7/2003 |
| JP | 2005-316360 | 11/2005 |

(Continued)

OTHER PUBLICATIONS

F. L. Brancia et al., "Rectangular waveform driven digital ion trap (DIT) mass spectrometer: theory and applications", In Practical Aspects of Trapped Ion Mass Spectrometry vol. IV—Theory and Instrumentation, Ed: R. E. March and J. F. J. Todd, CRC Press, London, pp. 273-307.

*Primary Examiner* — Sibin Chen
*Assistant Examiner* — Metasebia Retebo
(74) *Attorney, Agent, or Firm* — Sughrue Mion, PLLC

(57) ABSTRACT

A circuit for generating a voltage waveform at an output node. The circuit includes a voltage rail connected to the output node via a voltage rail switch; an anchor node 5 connected to the output node via an inductor and a bidirectional switch, wherein the bidirectional switch includes two or more transistors connected in series; and a control unit configured to change the voltage at the output node by controlling the voltage rail switch and the bidirectional switch so that, if a load capacitance is connected to the output node, a resonant circuit is established between the inductor 10 and the load capacitance. The circuit may be included in an apparatus for use in processing charged particles, e.g. for use in performing mass spectrometry or ion mobility spectrometry.

9 Claims, 12 Drawing Sheets

(51) Int. Cl.
  *H03K 5/00* (2006.01)
  *H03K 17/687* (2006.01)
  *H02M 7/537* (2006.01)
  *H03K 3/356* (2006.01)
  *H01J 49/02* (2006.01)
  *H02M 7/48* (2007.01)

(56) References Cited

U.S. PATENT DOCUMENTS

| | | | |
|---|---|---|---|
| 5,559,402 | A | 9/1996 | Corrigan, III |
| 5,642,018 | A | 6/1997 | Marcotte |
| 6,850,213 | B2 | 2/2005 | Marcotte |
| 7,026,765 | B2 | 4/2006 | Lee |
| 7,193,207 | B1 | 3/2007 | Ding et al. |
| 7,755,034 | B2 * | 7/2010 | Ding ............... H01J 49/0054 250/281 |
| 2004/0246746 | A1 | 12/2004 | Norrga et al. |
| 2006/0017388 | A1 * | 1/2006 | Stevenson ............ H01J 37/321 315/111.51 |
| 2007/0046586 | A1 * | 3/2007 | Choi ................ G09G 3/2965 345/68 |
| 2008/0042624 | A1 | 2/2008 | Augesky et al. |
| 2008/0136744 | A1 | 6/2008 | Tomio et al. |
| 2009/0238904 | A1 | 9/2009 | Seed |
| 2011/0062935 | A1 | 3/2011 | Gray et al. |

FOREIGN PATENT DOCUMENTS

| | | |
|---|---|---|
| KR | 10-2008-0042624 A | 5/2008 |
| RU | 2010392 C1 | 3/1994 |
| WO | 01/29875 A2 | 4/2001 |
| WO | 2010/125357 A2 | 11/2010 |

* cited by examiner (a)　　　　　　　　　　　　(b)

CIRCUIT FOR GENERATING A VOLTAGE WAVEFORM

BACKGROUND OF THE INVENTION

This invention relates to a circuit for generating a voltage waveform at an output node. The circuit is preferably included in an apparatus for use in processing charged particles, e.g. for use in performing mass spectrometry or ion mobility spectrometry. The present invention also relates to associated apparatuses and methods.

Numerous methods of performing mass spectrometry rely on the application of high frequency voltage waveforms to components of a mass spectrometer. For example, ion optical devices such as ion guides, ion traps, mass filters and other devices may all require such voltage waveforms, as is well described in the literature.

The quadrupole ion trap and quadrupole mass filter were first disclosed in U.S. Pat. No. 2,939,952 by W. Paul and H Steinwedel, in which several electrode structures to which radiofrequency waveforms can be applied are disclosed. The application of high frequency voltage waveforms to the electrode structures disclosed in this document produces a quadrupolar electric field which confines ions with certain characteristics to the device. Advancement of the theory has progressed and the state of the art has been well described in the book "Quadrupole Storage Mass Spectrometry" by R. E. March and R. J Hughes (Wiley Interscience) and the series of books edited by R. E. March and J. F. J. Todd, "Practical Aspects of Trapped Ion Mass Spectrometry", Volumes I-V (CRC Press).

Commercially available means for generating voltage waveforms suitable for use in trapping or confining ions in mass spectrometry have tended to rely on a resonant circuit.

Resonant circuits produce essentially sinusoidal voltage waveforms such as that shown in FIG. 1. Resonant circuits are well known for generating sinusoidal radiofrequency ("RF") voltage waveforms, and are used often in mass spectrometers or other devices. See, for example U.S. Pat. No. 2,939,952. The present inventors have observed that because such voltage waveforms are generated in a resonant manner, they are extremely efficient, needing little drive power to produce waveforms of high amplitude. However, it can be difficult to change the operating frequency of voltage waveforms produced by resonant circuits as to do this would usually require components making up the resonant circuit to be changed. Therefore in cases where it is desired to alter the operating frequency during operation, it is normally necessary to use a direct switching method that involves direct switching between different voltage levels.

Direct switching methods provide a significant advantage over resonant circuits in that the frequency of the voltage waveform can be easily changed during operation. However, existing direct switching techniques, which may be characterised as "hard switching" techniques, tend to be inefficient and power consumption is relatively large.

Examples of generating a high frequency waveform by direct switching methods that incorporate the use of a set of switches which are used to switch a voltage between two voltage levels by activating the switches alternately to generate a rectangular waveform are described in WO 01/29875 and U.S. Pat. No. 7,193,207B1, for example.

RU 2010392 is another example of a circuit for generating a voltage waveform at an output node, which uses a complex switching arrangement to switch between two voltage levels.

Circuits for generating voltage waveforms have been disclosed outside the field of mass spectrometry, see e.g. US2011/062935, U.S. Pat. No. 5,081,400, U.S. Pat. No. 7,026,765, KR20080042624, WO01/29875.

U.S. Pat. No. 7,755,034 discloses a quadrupole ion trap and methods of dissociating ions held within the quadrupole ion trap.

WO2010/125357 discloses an ion analysis apparatus for conducting differential ion mobility analysis and mass analysis.

SUMMARY OF THE INVENTION

The present invention has been devised in light of the above considerations.

Preferably, the present invention provides the advantages of both resonant circuits and hard switching methods for generating RF voltage waveforms to produce a flexible and efficient means for generating a high frequency voltage waveform.

In general, the present invention relates to a circuit for generating a voltage waveform at an output node, the circuit including:
  a voltage rail connected to the output node via a voltage rail switch;
  an anchor node connected to the output node via an inductor and a bidirectional switch; and
  a control unit configured to change the voltage at the output node by controlling the voltage rail switch and the bidirectional switch so that, if a load capacitance is connected to the output node, a resonant circuit is established between the inductor and the load capacitance.

As can be seen from the detailed discussion below, the inventors have found that changing the voltage by establishing a resonant circuit helps the voltage waveform to be generated in an energy efficient manner.

Accordingly, a circuit including the features listed above may herein be referred to as being with "energy recovery", to distinguish such a circuit from other circuits which may be referred to as being without "energy recovery".

In a first aspect, the invention may provide:
  A circuit for generating a voltage waveform at an output node, the circuit including:
  a voltage rail connected to the output node via a voltage rail switch;
  an anchor node connected to the output node via an inductor and a bidirectional switch, wherein the bidirectional switch includes two or more transistors connected in series; and
  a control unit configured to change the voltage at the output node by controlling the voltage rail switch and the bidirectional switch so that, if a load capacitance is connected to the output node, a resonant circuit is established between the inductor and the load capacitance.

As can be seen from the more detailed discussion below, by including two or more transistors connected in series in the bidirectional switch, the inventors have found that the voltage waveform can be generated in a particularly energy efficient manner.

Preferably, the two or more transistors connected in series include a pair of MOSFET transistors.

Preferably, the two or more transistors connected in series include a pair of transistors connected back-to-back, i.e. so that the direction of conventional current flow associated with the pair of transistors point in opposite directions. For example, a pair of MOSFETs connected back-to-back could have their sources connected together or their drains connected together. For example, a pair of npn transistors or a pair of pnp transistors could have their collectors connected together or their emitters connected together.

It is particularly preferred that the two or more transistors connected in series include a pair of MOSFET transistors connected back-to-back. As explained below, this arrangement leads to a bidirectional switch having a particularly low capacitance due to them being connected in series.

Herein, a voltage rail is to be understood as any circuit element configured to have (i.e. be at) a predetermined voltage, e.g. by being configured to be connected to a voltage supply having that voltage. Whilst a voltage rail is preferably connected to a voltage supply when the circuit is in use, a voltage rail need not be connected to a voltage supply at all times.

Preferably, the or each voltage rail (note that in some embodiments there can be more than one voltage rail, see below) is configured (respectively) to have a predetermined voltage whose magnitude is at least 10V, more preferably at least 50V, more preferably at least 100V (with respect to a ground).

Preferably, the or each voltage rail is configured (respectively) to have a predetermined voltage whose magnitude (with respect to a voltage of the anchor rail) is between 10V and 5000V, more preferably between 50V and 2500V, and even more preferably between 100V and 1000V.

More preferably, the or each voltage rail is configured (respectively) to have a predetermined voltage whose magnitude (with respect to a voltage of the anchor rail) can be varied, preferably across a range of values that extends from a first voltage value to a second voltage value. Preferably, the first voltage value is 10V or higher, more preferably 50V or higher, and even more preferably 100V or higher. Preferably, the second voltage value is 5000V or lower, more preferably 2500V or lower, more preferably 1000V or lower.

In the case that the circuit includes two voltage rails (see below), a first voltage rail and a second voltage rail preferably each have a predetermined voltage whose magnitude (with respect to a voltage of the anchor rail) is substantially equal to, and whose polarity is opposite to, that of the other voltage rail, so as to ensure that the established resonant circuits works effectively.

Preferably, the circuit is a switching circuit for generating a switching waveform that switches between a first voltage and a second voltage, preferably at a frequency that is between 10 kHz and 100 MHz, more preferably 100 kHz and 10 MHz and most preferably between 500 kHz and 5 MHz.

In a "two rail" circuit (see below), the first voltage may be a voltage of a first voltage rail and the second voltage may be a voltage of a second voltage rail.

In a "one rail" circuit (see below), the first voltage may be a voltage of the (only) voltage rail and the second voltage may be a floating voltage.

Preferably, the control unit is configured to change the frequency at which the switching voltage waveform switches between the first voltage and the second voltage, preferably across a range of values that extends from a first frequency value to a second frequency value, preferably based on a user input. Preferably, the first frequency value is 10 kHz or higher, more preferably 100 kHz or higher, more preferably 500 kHz or higher. Preferably, the second frequency value is 100 MHz or lower, more preferably 10 MHz or lower, more preferably 5 MHz or lower. It is thought that current ferrite transformers may struggle to cope with frequencies that are higher than these second frequency values.

The term "anchor" in "anchor node" is used simply as a label, to distinguish an "anchor node" from an "output node". The reason the term "anchor" has been chosen is that the "anchor node" can be seen as providing a voltage which can exert influence on a resonant circuit if it is connected to the resonant circuit. However, this should not be seen as being particularly limiting on the form in which the "anchor node" can take since, as can be seen from the embodiments discussed below, the "anchor node" can take various forms, e.g. it could be a local ground or an output node.

Herein, a "resonant circuit" established between an inductor and a capacitor may be understood as a circuit in which the inductor and capacitor are connected together, preferably whilst being disconnected from a voltage rail. The "resonant circuit" may also include the anchor node connected to the output node via the inductor and the bidirectional switch. As is well known in the art, electrical energy stored in a resonant circuit will have a tendency to oscillate at a resonant frequency. For the avoidance of any doubt, a "resonant circuit" can be viewed as having been established even if electrical energy within the resonant circuit does not complete a full cycle of oscillation before a different circuit is established (e.g. by modifying the circuit to stop resonance).

Preferably, the control unit is configured to, when the resonant circuit is established, close a voltage rail switch connected to the output node (note that in some embodiments there can be more than one voltage rail switch, see below) and open the bidirectional switch when the voltage at the output node is at or near to (e.g. within 10% of) a maximum (preferably the first or second maximum to occur) caused by converting of magnetic energy of the inductor to the electric energy of the load capacitor in the resonant circuit. As discussed below, this helps the voltage at the output node to be changed in a particularly efficient manner.

Preferably, the circuit includes two voltage rails, rather than just one voltage rail. In this case, the circuit may herein be referred to for brevity as a "two rail" circuit. An advantage of a "two rail" circuit is that the voltage waveform can be clamped to both the voltage of the first voltage rail and the voltage of the second voltage rail, which can help produce a better defined voltage waveform.

Preferably, in what may be an example of a "two rail" circuit, the circuit includes:
  a first voltage rail connected to the output node via a first voltage rail switch;
  a second voltage rail connected to the output node via a second voltage rail switch;
  wherein the control unit is configured to change the voltage at the output node by controlling the first voltage rail switch, the second voltage rail switch and the bidirectional switch so that, if a load capacitance is connected to the output node, a resonant circuit is established between the inductor and the load capacitance.

Preferably, in what may be a "two rail" circuit, the control unit of the circuit is configured to control the circuit to operate according to a control method including:
  opening the bidirectional switch and closing the first voltage rail switch so that the output node is clamped at the voltage of the first voltage rail;
  causing the voltage at the output node to swing towards the voltage of the second voltage rail by opening the first voltage rail switch and closing the bidirectional switch so that a resonant circuit is established between the inductor and the load capacitance;
  opening the bidirectional switch and closing the second voltage rail switch so that the output node is clamped at the voltage of the second voltage rail;
  causing the voltage at the output node to swing towards the voltage of the first voltage rail by opening the second voltage rail switch and closing the bidirectional switch so that a resonant circuit is established between the inductor and the load capacitance. The control method may include repeating these steps.

In the first and third steps, opening the bidirectional switch is preferably performed before closing the first/second voltage rail switch so as to avoid shorting the first/second voltage rail to the anchor node. The time gap between opening the bidirectional switch and closing the first/second voltage rail switch is preferably very small, e.g. 100 ns or less.

Causing the voltage at the output node to swing towards the voltage of the first voltage rail is preferably performed after a predetermined delay. The predetermined delay may be set so as to achieve a desired frequency of the switching waveform.

However, the presence of two voltage rails is not required and control methods may be devised for circuits that do not include a second voltage rail as defined above. In this case, the circuit may herein be referred to for brevity as a "one rail" circuit.

In what may be a "one rail" circuit, the control unit of the circuit may be configured to control the circuit to operate according to a control method including:
  opening the bidirectional switch and closing the voltage rail switch so that the output node is clamped at the voltage of the voltage rail;
  causing the voltage at the output node to swing towards a floating voltage by opening the voltage rail switch and closing the bidirectional switch so that a resonant circuit is established between the inductor and the load capacitance;
  opening the bidirectional switch without closing the voltage rail switch so that the output node is held at the floating voltage (it is thought by virtue of charge retained in the capacitor);
  causing the voltage at the output node to swing towards the voltage of the voltage rail by closing the bidirectional switch so that a resonant circuit is established between the inductor and the load capacitance. The control method may include repeating these steps.

In the first step, opening the bidirectional switch is preferably performed before closing the voltage rail switch so as to avoid shorting the voltage rail to the anchor node. The time gap between opening the bidirectional switch and closing the first/second voltage rail switch is preferably very small, e.g. 100 ns or less.

In both the second and fourth steps, the bidirectional switch may be closed for a time corresponding to a half period of the resonant frequency during which the resonant circuit is established between the inductor and the load capacitance, e.g. to produce a regular waveform similar to that shown in FIG. 15. Other timing options to produce other waveforms would equally be possible, as would be appreciated by a skilled person.

In what may be a "one rail" circuit, the control unit of the circuit may be configured to control the circuit to operate according to a control method including:
  opening the bidirectional switch and closing the voltage rail switch so that the output node is clamped at the voltage of the voltage rail;
  causing the voltage at the output node to swing away from and back towards the voltage of the voltage rail by opening the first voltage rail switch and closing the bidirectional so that a resonant circuit is established between the inductor and the load capacitance.

In the first step, opening the bidirectional switch is preferably performed before closing the voltage rail switch so as to avoid shorting the voltage rail to the anchor node. The time gap between opening the bidirectional switch and closing the first/second voltage rail switch is preferably very small, e.g. 100 ns or less.

In the second step, the bidirectional switch may be closed for a time corresponding to a full period of the resonant frequency during which the resonant circuit is established between the inductor and the load capacitance, e.g. to produce a regular waveform similar to that shown in FIG. 14. Other timing options to produce other waveforms would equally be possible, as would be appreciated by a skilled person.

The circuit may be for generating an additional voltage waveform at an additional output node, wherein the additional voltage waveform is inverted (i.e. in antiphase) with respect to the voltage waveform. In this case, the circuit may herein be referred to for brevity as a "full-bridge" circuit. Consequently, a circuit which does not include an additional node may herein be referred to for brevity as a "half-bridge" circuit.

Preferably, in what may be a "full-bridge" circuit, the circuit includes:
  a voltage rail connected to an output node via a voltage rail switch and connected to an additional output node via an additional voltage rail switch;
  a first anchor node connected to the output node via an inductor and a bidirectional switch that includes two or more transistors connected in series;
  a second anchor node connected to the additional output node via an inductor and a bidirectional switch that includes two or more transistors connected in series;
  wherein the control unit is configured to change the voltage at the output node by controlling the voltage rail switch and the bidirectional switch connected to the first anchor node so that, if a load capacitance is connected between the output node and the additional output node, a resonant circuit is established between the inductor connected to the first anchor node and the load capacitance; and
  wherein the control unit is configured to change the voltage at the additional output node by controlling the additional voltage rail switch and the bidirectional switch connected to the second anchor node so that, if a load capacitance is connected between the output node and the additional output node, a resonant circuit is established between the inductor connected to the second anchor node and the load capacitance.

Preferably, a "full-bridge" circuit is combined with a "two rail" circuit to provide a "two rail full-bridge" circuit.

Preferably, in what may be an example of a "two rail full-bridge" circuit, the circuit includes:
  a first voltage rail connected to the output node via a first voltage rail switch and connected to the additional output node via an additional first voltage rail switch;
  a second voltage rail connected to the output node via a second voltage rail switch and connected to the additional output node via an additional second voltage rail switch;
  a first anchor node connected to the output node via an inductor and a bidirectional switch that includes two or more transistors connected in series;
  a second anchor node connected to the additional output node via an inductor and a bidirectional switch that includes two or more transistors connected in series;
  wherein the control unit is configured to change the voltage at the output node by controlling the first voltage rail switch, the second voltage rail switch and the bidirectional switch connected to the first anchor node so that, if a load capacitance is connected between the output node and the additional output node, a resonant circuit is established between the inductor connected to the first anchor node and the load capacitance; and wherein the control unit is configured to change the voltage at the additional output node by controlling the additional first voltage rail switch, the additional second voltage rail switch and the bidirectional switch connected to the second anchor node so that, if a load capacitance is connected between the output node and the additional output node, a resonant circuit is established between the inductor connected to the second anchor node and the load capacitance.

However, the presence of two voltage rails is not required and control methods may be devised for "full-bridge" circuits that do not include a second voltage rail as defined above. In that case, the circuit may herein be referred to for brevity as a "one rail full-bridge" circuit.

Preferably:

the circuit includes a shared inductor, wherein the shared inductor acts as both the inductor connected to the first anchor node and the inductor connected to the second anchor node;

the circuit includes a shared bidirectional switch, wherein the shared bidirectional switch acts as both the bidirectional switch connected to the first anchor node and the bidirectional switch connected to the second anchor node;

the output node acts as the second anchor node; and the additional output node acts as the first anchor node.

In this case, the circuit may herein be referred to for brevity as a "one rail full-bridge shared inductor" circuit or a "two rail full-bridge shared inductor" circuit, depending on how many voltage rails are included in the circuit.

However, this need not be the case and in other embodiments the circuit may include:

separate inductors that act as the inductor connected to the first anchor node and the inductor connected to the second anchor node;

separate bidirectional switches that act as the bidirectional switch connected to the first anchor node and the bidirectional switch connected to the second anchor node;

first and second anchor nodes that are separate from the output node and additional output node.

In this case, the circuit may herein be referred to for brevity as a "one rail full-bridge separate inductor" circuit or a "two rail full-bridge separate inductor" circuit.

Different control methods may be devised, depending on the configuration of the circuit.

Preferably, in what may be a "two-rail full-bridge shared inductor" circuit, the control unit of the circuit is configured to control the circuit to operate according to a control method including:

closing the first voltage rail switch, closing the additional second voltage rail switch and opening the shared bidirectional switch so that the output node is clamped at the voltage of the first voltage rail and the additional output node is clamped at the voltage of the second voltage rail;

causing the voltage at the output node to swing towards the voltage of the second voltage rail and the voltage at the additional output node to swing towards the voltage of the first voltage rail by opening the first voltage rail switch, opening the additional second voltage switch and closing the shared bidirectional switch so that a resonant circuit is established between the inductor and the load capacitance;

closing the second voltage rail switch, closing the additional first voltage rail switch and opening the shared bidirectional switch so that the output node is clamped at the voltage of the second voltage rail and the additional output node is clamped at the voltage of the first voltage rail;

causing the voltage at the output node to swing towards the voltage of the first voltage rail and the voltage at the additional output node to swing towards the voltage of the second voltage rail by opening the second voltage rail switch, opening the additional first voltage rail switch and closing the shared bidirectional switch so that a resonant circuit is established between the inductor and the load capacitance. The control method may include repeating these steps.

In what may be an example of a "two rail full-bridge separate inductor" circuit, the control unit of the circuit may be configured to control the circuit to operate according to a control method including:

closing the first voltage rail switch, closing the additional second voltage rail switch, opening the bidirectional switch connected to the first anchor node and opening the bidirectional switch connected to the second anchor node so that the output node is clamped at the voltage of the first voltage rail and the additional output node is clamped at the voltage of the second voltage rail;

causing the voltage at the output node to swing towards the voltage of the second voltage rail and the voltage at the additional output node to swing towards the voltage of the first voltage rail by opening the first voltage rail switch, opening the additional second voltage switch, closing the bidirectional switch connected to the first anchor node and closing the bidirectional switch connected to the second anchor node so that a first resonant circuit is established between the inductor connected to the first anchor node and the load capacitance and so that a second resonant circuit is established between the inductor connected to the second anchor node and the load capacitance;

closing the second voltage rail switch, closing the additional first voltage rail switch, opening the bidirectional switch connected to the first anchor node and opening the bidirectional switch connected to the second anchor node so that the output node is clamped at the voltage of the second voltage rail and the additional output node is clamped at the voltage of the first voltage rail;

causing the voltage at the output node to swing towards the voltage of the first voltage rail and the voltage at the additional output node to swing towards the voltage of the second voltage rail by opening the second voltage rail switch, opening the additional first voltage rail switch, closing the bidirectional switch connected to the first anchor node and closing the bidirectional switch connected to the second anchor node so that a first resonant circuit is established between the inductor connected to the first anchor node and the load capacitance and so that a second resonant circuit is established between the inductor connected to the second anchor node and the load capacitance. The control method may include repeating these steps.

In what may be an example of a "one rail full-bridge shared inductor" circuit, the control unit of the circuit may be configured to control the circuit to operate according to a control method including:

closing the first voltage rail switch and opening the shared bidirectional switch so that the output node is clamped at the voltage of the first voltage rail and the additional output node is held at a floating voltage;

causing the voltage at the output node to swing towards the floating voltage and the voltage at the additional output node to swing towards the voltage of the first voltage rail by opening the first voltage rail switch and closing the shared bidirectional switch so that a resonant circuit is established between the inductor and the load capacitance;

closing the additional first voltage rail switch and opening the shared bidirectional switch so that the output node is held at a floating voltage and the additional output node is clamped at the voltage of the first voltage rail;

causing the voltage at the output node to swing towards the voltage of the first voltage rail and the voltage at the additional output node to swing towards the floating voltage by opening the additional first voltage rail switch and closing the shared bidirectional switch so that a resonant circuit is established between the inductor and the load capacitance. The control method may include repeating these steps.

In what may be an example of a "one rail full-bridge separate inductor" circuit, the control unit of the circuit may be configured to control the circuit to operate according to a control method including:

closing the first voltage rail switch, opening the bidirectional switch connected to the first anchor node and opening the bidirectional switch connected to the second anchor node so that the output node is clamped at the voltage of the first voltage rail and the additional output node is held at a floating voltage;

causing the voltage at the output node to swing towards the floating voltage and the voltage at the additional output node to swing towards the voltage of the first voltage rail by opening the first voltage rail switch, closing the bidirectional switch connected to the first anchor node and closing the bidirectional switch connected to the second anchor node so that a first resonant circuit is established between the inductor connected to the first anchor node and the load capacitance and so that a second resonant circuit is established between the inductor connected to the second anchor node and the load capacitance;

closing the additional first voltage rail switch, opening the bidirectional switch connected to the first anchor node and opening the bidirectional switch connected to the second anchor node so that the output node is held at a floating voltage and the additional output node is clamped at the voltage of the first voltage rail;

causing the voltage at the output node to swing towards the voltage of the first voltage rail and the voltage at the additional output node to swing towards the floating voltage by opening the additional first voltage rail switch, closing the bidirectional switch connected to the first anchor node and closing the bidirectional switch connected to the second anchor node so that a first resonant circuit is established between the inductor connected to the first anchor node and the load capacitance and so that a second resonant circuit is established between the inductor connected to the second anchor node and the load capacitance. The control method may include repeating these steps.

The circuit may include the load capacitance. The load capacitance may be included as part of an apparatus for use in processing charged particles, e.g. for use in performing mass spectrometry or ion mobility spectrometry.

The second aspect of the invention may provide an apparatus for use in mass spectrometry that includes a circuit according to the first aspect of the invention.

For example, the second aspect of the invention may provide:

An apparatus for use in processing charged particles, the apparatus including:
a circuit according to the first aspect of the invention;
a load capacitance to which the output node of the circuit is connected so that, in use, the load capacitance receives a voltage waveform generated by the circuit.

The load capacitance may be included in any component(s) suitable for use in processing charged particles, e.g. for use in performing mass spectrometry or ion mobility spectrometry. For example the at least one load capacitance may be included in or form part of:
an ion optical device for altering or containing a flight path of ions; and/or
a mass filter; and/or
an ion trap; and/or
an ion transfer device; and/or
an ion mobility device.

Preferably, the load capacitance is included in an ion optical device for altering or containing a flight path of ions.

If the circuit includes an output node and an additional output node (see above), the apparatus preferably includes a load capacitance, wherein the load capacitance includes:
at least one first electrode (e.g. a pair of first electrodes) to which the output node of the circuit is connected so that, in use, the at least one first electrode receives a voltage waveform generated by the circuit;
at least one second electrode (e.g. a pair of second electrodes) to which the additional output node of the circuit is connected so that, in use, the at least one load capacitance receives an additional voltage waveform generated by the circuit.

Preferably the electrodes are formed from rods or plates and are preferably configured such that they are disposed around an ion optical axis. Any number of rods/plates may be used. The rods may have hyperbolic shaped faces.

The apparatus may be a mass spectrometer.
The apparatus may also include:
an ion source configured to produce ions;
an ion processing region configured to process ions;
a mass analyser configured to separate the ions according to their mass/charge ratio;
a detector configured to detect the separated ions. In this case, the apparatus may be viewed as a mass spectrometer.

The load capacitance may be included in the ion source and/or the ion processing region and/or the mass analyser and/or the detector, for example.

A third aspect of the invention may also provide a method of controlling a circuit according to any previous aspect of the invention to operate according to a control method as described in connection with any previous aspect of the invention.

The method may be a method of processing charged particles, e.g. for use in performing mass spectrometry or ion mobility spectrometry.

A fourth aspect of the invention may provide a computer-readable medium having computer-executable instructions configured to control a circuit according to any previous aspect of the invention to operate according to a control method as described in connection with any previous aspect of the invention.

A fifth aspect of the invention may provide a circuit, an apparatus for use in processing charged particles, a method of controlling a circuit and/or a computer-readable medium as set out in any previous aspect of the invention, except that the bidirectional switch (or each bidirectional switch, if more than one bidirectional switch is present) is not required to include two or more transistors connected in series.

BRIEF DESCRIPTION OF THE DRAWINGS

The invention also includes any combination of the aspects and preferred features described except where such a combination is clearly impermissible or expressly avoided.

Examples of our proposals are discussed below, with reference to the accompanying drawings in which.

DETAILED DESCRIPTION OF THE EXEMPLARY EMBODIMENTS

Overview

In general, the following discussion describes examples of the inventors' proposals for incorporating "energy recovery" in a switching circuit for generating a high frequency switching voltage waveform across a load capacitance, which could e.g. be included in a component of a mass spectrometer. The switching circuit with energy recovery preferably has reduced power consumption compared with previous switching circuits, thereby potentially improving reliability and potentially further extending the range of operation of the switching circuit to increased applied voltages.

It is envisaged that the switching circuit disclosed herein would be applicable in the field of mass spectrometry, e.g. where one or more components of an apparatus for use in performing mass spectrometry might receive a voltage waveform generated by the switching circuit. The one or more components may include one or more ion optical devices which operate employing the principles of electrodynamics. Such ion optical devices might include one or more ion traps (such as, for example, a linear ion trap, a quadrupole ion trap, or other types of ion trap).

Other possible uses for the circuit in processing charged particles could include, for example, using the voltage waveform for analysis of charged particles such as, for example, Differential Mobility Spectrometry (or Field Asymmetric Waveform Ion Mobility Spectrometry) or for mass analysis by known mass spectrometric methods such as mass filters or ion traps. Another possible application for the voltage waveform might be for use in ion transfer, collection, guiding or focussing of ions (such as, for example, application to multipole ion guides, stacked ring electrode ion guides or other ion transfer devices).

The switching circuit may also find uses other than processing charged particles, e.g. in other fields in which it is desirable to produce high frequency switching voltage waveforms.

Two Rail Switching Circuit (without Energy Recovery)

Figure 1:
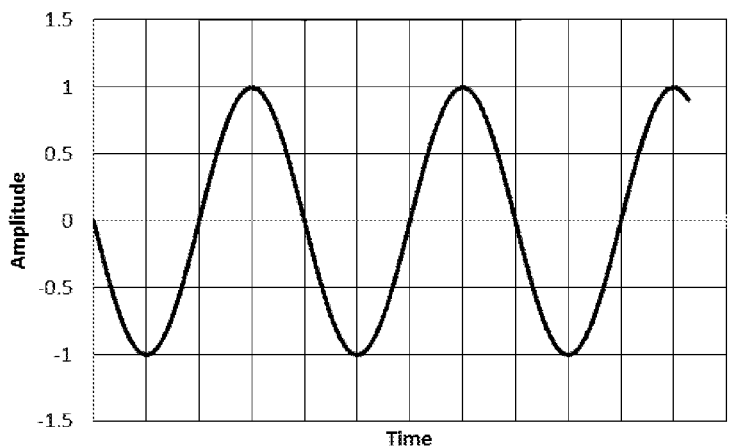
FIG. 1 shows an example of a sinusoidal waveform produced by a resonant circuit.
Figure 2:
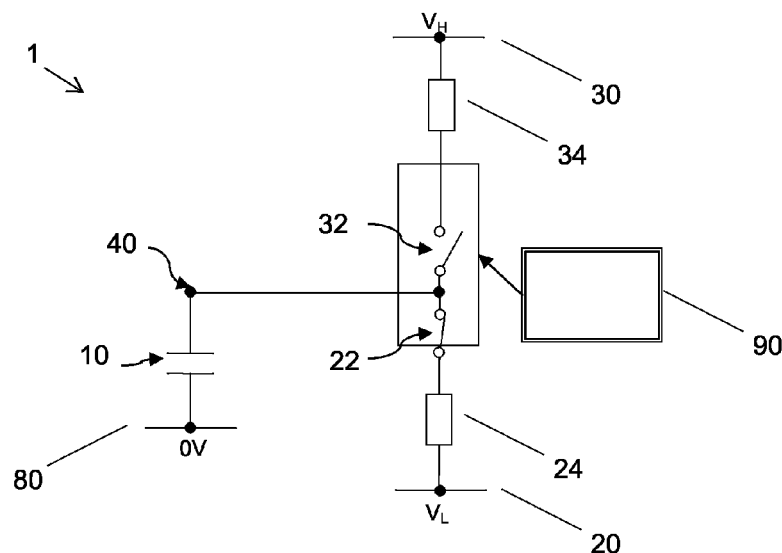
FIG. 2 is a schematic showing an example of a two-rail half-bridge switching circuit without energy recovery, for generating a high frequency switching voltage waveform by a direct switching method.

FIG. 2 is an example of a switching circuit 1 for generating a high frequency switching voltage waveform by a direct switching method.

The switching circuit 1 may e.g. operate at radiofrequencies and, as will be described in more detail below, incorporates two switches, which may be controlled digitally.

The switching circuit 1 of FIG. 2 preferably has a load capacitance 10 ($C_L$), a first voltage rail 20 configured to have a first voltage ($V_L$), a first voltage rail switch 22 ($S_1$), a first voltage rail current limiting resistor 24 ($R_1$), a second voltage rail 30 configured to have a second voltage ($V_H$), a second voltage rail switch 32 ($S_2$), a second voltage rail current limiting resistor 34 ($R_2$), an output node 40, and a control unit 90.

For clarity, the current limiting resistors 24, 34 are not shown in some of the switching circuits described below, but a skilled person would readily appreciate that either/both of these resistors may be included in any of the circuits described below. A skilled person would also recognise that the current limiting resistors 24, 34 need not be placed in the position depicted in FIG. 2, but could instead be placed at other appropriate positions within the circuits described below.

The first voltage rail 20 is preferably configured to have (i.e. be at) the first voltage ($V_L$) by being connected to a first voltage supply (not shown) having the first voltage ($V_L$). Similarly, the second voltage rail 30 is preferably configured to have the second voltage ($V_H$) by being connected to a second voltage supply (not shown) having the second voltage ($V_H$). Preferably, the first voltage ($V_L$) is lower than the second voltage ($V_H$).

In the switching circuit 1 shown in FIG. 2, the load capacitance 10 is preferably connected to the output node 40. The first voltage rail 20 is preferably connected to the output node 40 via the first voltage rail switch 22 and the first voltage rail current limiting resistor 24. The second voltage rail 30 is preferably connected to the output node 40 by the second voltage rail switch 32 and the second voltage rail current limiting resistor 34.

In this example, the load capacitance 10 is shown as being connected between the output node 40 and a ground 80 (0 V), but this need not be the case.

The load capacitance 10 could, for example, be included in a mass spectrometer, possibly a three dimensional ion trap, a quadrupole ion trap, a linear ion trap, a mass filter or any other device configured to confine ions, for example.

Figure 3:
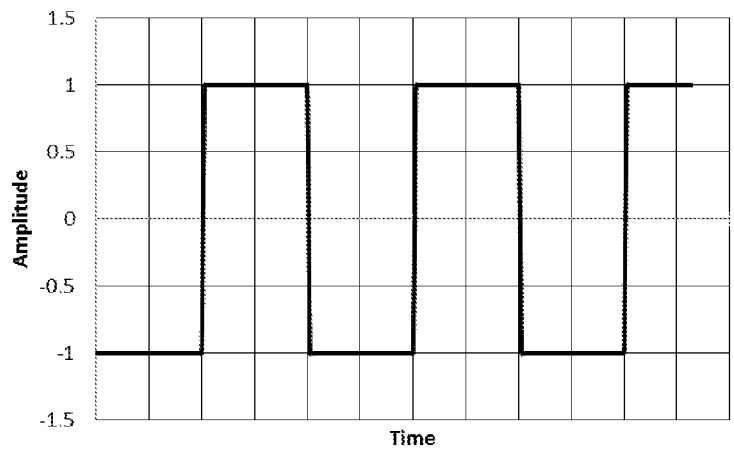
FIG. 3 shows an example voltage waveform which might be measured at the output node in the switching circuit of FIG. 2, if the two voltage rail switches were driven alternately under digital control.

In the switching circuit 1 shown in FIG. 2, the control unit 90, which is preferably operated digitally, is configured to operate the circuit according to a control method in which the first and second voltage rail switches 22, 32 are alternately opened or closed. In this manner the load capacitance 10 can alternately charge from $V_H$ to $V_L$, creating a voltage waveform resembling that shown in FIG. 3.

Metal oxide semiconductor field effect transistors (MOSFETs) may be used as the first and second voltage rail switches 22, 32, but other types of component which can form a switch could equally be used, e.g. npn transistors. Those skilled in the art will recognise that the steepness and shape of the rising and falling edges can be determined from the values of the current limiting resistors 24, 34 and capacitance of the load capacitance 10.

Alternative control methods for driving the first and second voltage rail switches 22, 32 can be envisaged, such as incorporating periods where both switches are open, thereby generating a period where zero voltage is applied to the load capacitance 10.

An analysis of the switching circuit 1 allows the average power consumption to be determined. With the load capacitance 10 ($C_L$) discharged, the second voltage rail switch 32 ($S_2$) open and the first voltage rail switch ($S_1$) closed at time t=0, the current into the load capacitance 10 ($C_L$) may be given by:

$$I=V\exp(-t/CR)/R \quad [1]$$

Where V represents the average magnitude of the voltages $V_H$ and $V_L$, C represents the total capacitance of the circuit incorporating $C_L$ plus any other capacitances present (for example, in the switches) and R represents the resistance of the circuit.

Integrating Equation 1 with respect to time, t, gives:

$$\int I dt=-CRV\exp(-t/CR)/R+c=-CV\exp(-t/CR)+c \quad [2]$$

When t=0 the integral of the current will also be zero, implying that c=CV
Therefore:

$$\int i.dt=CV(1-\exp(-t/CR)) \quad [3]$$

It can be seen from Equation 3 that, assuming the load capacitance 10 has completed most of its charge cycle during the period when the first voltage rail switch 22 ($S_1$) is closed (and to achieve an approximately square or rectangular output waveform this has to be the case), the resistor R has no effect on the average current drawn from the supply (it only affects the damping characteristic and takes a share of the power dissipation with the switching transistors).

The next and all subsequent charge cycles take the load capacitance 10 from the voltage $V_H$ of the more positive second voltage rail 30 to the voltage $V_L$ of the more negative first voltage rail 20 or vice-versa. So, the average current is equal to 2 CVf where f represents the frequency of switching. Therefore it can be seen that the average power is given by:

$$P=4CV^2f \quad [4]$$

Where P is the average power consumption of the switching circuit 1 when operating at a voltage V (average magnitude of $V_H$ and $V_L$) and driving a load capacitance C. It can be seen that the power is proportional to the square of the voltage and directly proportional to the frequency.

One advantage of circuits which implement a direct switching method, such as the switching circuit 1 of FIG. 2, is the ability to simply change both the drive amplitude and frequency. However, the present inventors have observed, as the circuit is not dependent on a resonant circuit, an increase in voltage requires a corresponding increase in power.

The ability to change the frequency of a voltage waveform may find application in mass spectrometry, for example, where the ability to alter the radiofrequency of a voltage waveform applied to an ion trap, for example, confers analytical advantages, see e.g. WO 01/29875. However, a disadvantage of a switching circuit which implements a direct switching method is that, as shown in the analysis above, the power required to produce such a waveform scales according to the square of the voltage. Hence a doubling of the voltage requires a four-fold increase in the power required to generate the voltage waveform.

Two Rail Half-Bridge Switching Circuit (with Energy Recovery)

Preferably, the present invention overcomes the disadvantages associated with the switching circuit 1 shown in FIG. 2, preferably by providing a switching circuit that combines both the resonant type circuit (which has the advantage of low power consumption for a given applied voltage) and the direct switching method (which has the advantage of being able to change frequency simply).

Figure 4:
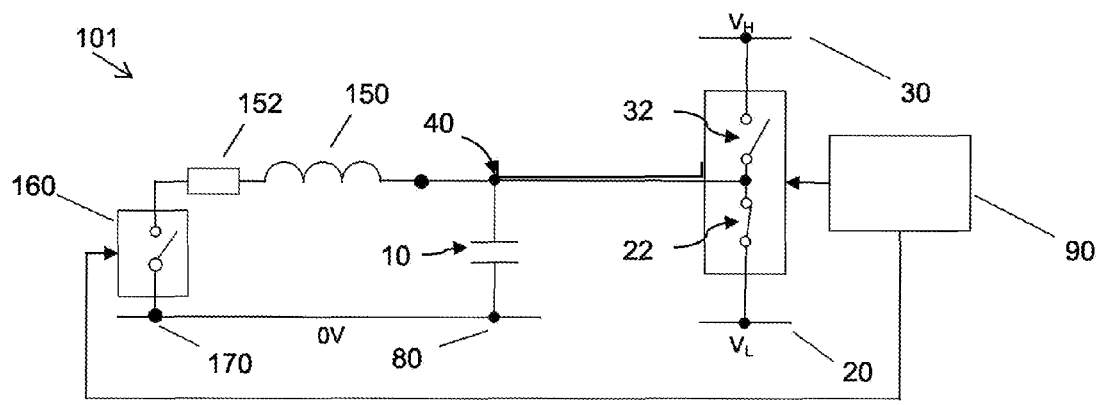
FIG. 4 is a schematic showing an example of a two-rail half-bridge switching circuit with energy recovery.

FIG. 4 shows a two-rail half-bridge switching circuit 101 with energy recovery.

In FIG. 4 and subsequent diagrams, alike components are given the same or corresponding reference numerals and need not be described further herein.

The switching circuit 101 of FIG. 4 may be obtained by taking the switching circuit 1 described with reference to FIG. 2 (above) and incorporating an inductor 150 (L) and a bidirectional switch 160 ($S_B$).

The control unit 90 is still preferably operated digitally, but is preferably configured to operate the switching circuit 101 according to a different control method, e.g. as described below.

Preferably, in the switching circuit 101 of FIG. 4, an anchor node 170 is connected to the output node 40 via the inductor 150, a resistance 152 associated with the inductor 150, and the bidirectional switch 160. Moreover, the control unit 90 is preferably configured to change the voltage at the output node 40 by controlling the first voltage rail switch 22, the second voltage rail switch 32 and the bidirectional switch 160 so that, if the load capacitance 10 is connected to the output node 40 (e.g. between the output node 40 and a ground 80 as shown in FIG. 4), a resonant circuit is established between the inductor 150 and the load capacitance 10.

In the example of FIG. 4, the anchor node 170 is connected to the ground 80, but this need not be the case, as discussed with reference to other embodiments described in more detail below (see e.g. FIG. 11).

The label "bidirectional" used to describe the bidirectional switch 160 means that the bidirectional switch 160 is configured to allow current to flow in either direction through the bidirectional switch 160. Of course, those skilled in the art will appreciate that the bidirectional switch 160 can be located on either side of the inductor 150.

Preferably, the control unit 90 is configured to control the switching circuit 101 of FIG. 4 to operate according to a control method including:
 a) Closing the first voltage rail switch 22 and opening the bidirectional switch 160 so that the output node 40 is clamped at the first voltage $V_L$ (i.e. the voltage of the first voltage rail 20). As a consequence, the load capacitance 10 charges to $V_L$.
 b) Causing the voltage at the output node 40 to swing towards the second voltage $V_H$ (i.e. the voltage of the second voltage rail 30) by opening the first voltage rail switch 22 and closing the bidirectional switch 160 so that a resonant circuit is established between the inductor 150 and the load capacitance 10. As a consequence, the voltage at the output node 40 swings close to $V_H$ (but not quite all the way, due to damping resistance inherent in the circuit).
 c) Closing the second voltage rail switch 32 and opening the bidirectional switch 160 so that the output node 40 is clamped at the second voltage $V_H$ (i.e. the voltage of the second voltage rail 30). As a consequence, the load capacitance 10 charges to $V_H$.
 d) Causing the voltage at the output node 40 to swing towards the first voltage $V_L$ by opening the second voltage rail switch 32 and closing the bidirectional switch 160 so that a resonant circuit is established between the inductor 150 and the load capacitance 10. As a consequence, the voltage at the output node 40 swings close to $V_L$ (but not quite all the way, due to damping).
 e) The sequence is then repeated, starting again at (a).

An example switch timing sequence for the first voltage rail switch 22 ($S_1$), the second voltage rail switch 32 ($S_2$) and the bidirectional switch 160 ($S_B$) for the circuit shown in FIG. 4 is shown in FIG. 5(a). An example waveform resulting from this switch timing sequence is shown in FIG. 5(b). Here, it should also be noted that the timings do not necessarily need to be such that the mark-space ratio is 1 (or duty cycle is 50%) as shown in FIG. 5(a). The timings can also be altered such that a required frequency is generated.

Figure 5:
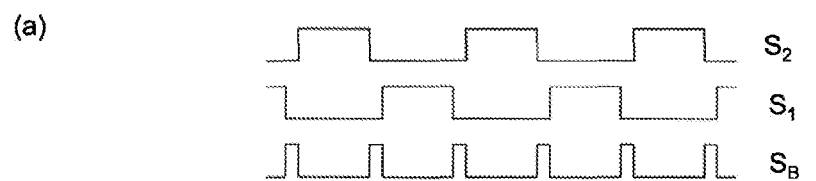
FIG. 5 shows (a) an example switch timing sequence and (b) an example voltage waveform produced using this switch timing sequence for the switching circuit shown in FIG. 4.
Figure 5:
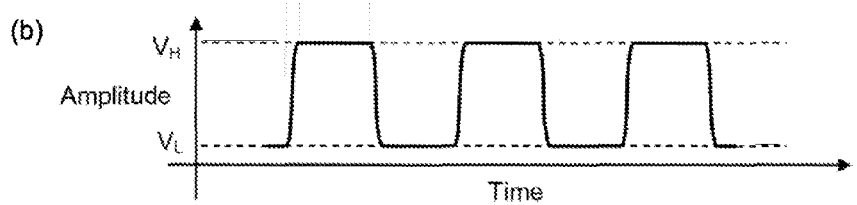

Note that the timing of the switches does not need to be such that the first and second voltage rail switches 22, 32 are closed when the voltage at the output node 40 is at or near to a first maximum caused by the resonance effect where the magnetic energy in the inductor is converted back to the electric energy in the capacitor, as shown in FIG. 5. However, this approach leads to the most efficient method of reducing power consumption by minimising undershoot of the damped resonant section of the circuit. Nonetheless, the first and second voltage rail switches 22, 32 can potentially be switched at any point during resonance of electrical energy in the resonant circuit. For example, control methods could be envisaged where the voltage rail switches 22, 32 are switched not at the first maximum in the damped resonant sine wave, but at the second, third, or any other maximum or minimum.

In the circuit 101 shown in FIG. 4, $V_L$ and $V_H$ represent potentials of equal but opposite magnitude, with 0 V situated midway between these voltages. However, it should be noted that the voltages of the first voltage rail 20, the second voltage rail 30 and the anchor node 180 could take several forms.

Those skilled in the art will recognise that the product $LC_L$ only has a bearing on the rise and fall times of the generated voltage waveform. The frequency of the voltage rectangular waveform can be varied by changing the period of the drive signals to the first and second voltage rail switches 22, 32. Provided the width of pulses to the bidirectional switch 160 remains the same, there need not be any change to the characteristics of the rising and falling edges.

Taking an analytical approach, the conditions present at point (d) in the sequence above trigger a second order natural response having the characteristic equation:

$$Ld^2i/dt^2 + Rdi/dt + i/C = 0 \quad [5]$$

Where L is the inductance of inductor 150 in FIG. 4, $d^2i/dt^2$ is the second order differential of current through the inductor I with respect to time t, R is the resistance 152 associated with the inductor 150 shown in FIG. 4 and C represents the total load capacitance of the circuit 101. By letting $i = A \exp(j\omega t)$ and applying Euler's theorem, $\exp(j\omega t) = \cos \omega t + j \sin \omega t$, the following relationship may be obtained:

$$i = A\exp(-\alpha t)\sin(\omega t) \quad [6]$$

Where A is the peak value of i and is determined by differentiating Equation 6 and applying the initial condition, t=0. This leads to the relationship:

$$di/dt = \omega A \quad [7]$$

However, it is also known that V=Ldi/dt, which implies that di/dt=V/L. Using this fact together with Equation 7 gives the relationship A=V/ωL. Given also that in Equation 6 α is the damping coefficient α=R/2L where R is the total resistance of L and $S_B$ and that ω is the radial frequency $\omega = \sqrt{(1/LC - R^2/4L^2)}$, the terms of Equation 6 are known.

Figure 6:
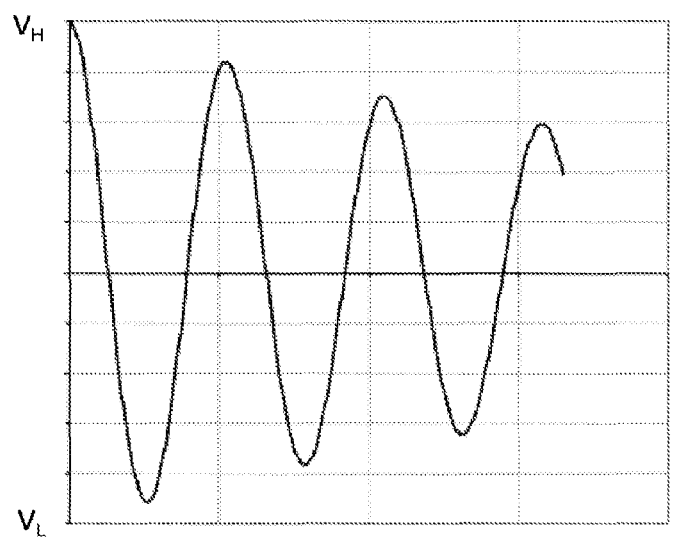
FIG. 6 is a plot showing the natural frequency response of the switching circuit of FIG. 4 for an example set of voltages.

The solution of Equation 6 has complex roots and exhibits an exponentially decaying voltage oscillation with a 90° phase lagging current response. This is shown in FIG. 6. The response illustrated assumes an inductance of 1.5 μH, a load capacitance of 47 pF and R=5Ω. Only the first half cycle of the voltage waveform is generally used to swing the output from rail to rail and the transition is complete in approximately 26.5 ns in this example.

It can be seen from FIG. 6 that the trace corresponding to the voltage at the output node 150 does not quite reach $V_L$ at the first half cycle and thus some energy has been lost in the process (it is thought this energy is lost thermally by heating up the circuit components such as the resistors and/or switches). The voltage rail switches 22, 32 therefore have to provide the final step to clamp the output node 150 to the supply rail and it is the amount of work that the voltage rail switches 22, 32 do during this process that largely affects the efficiency of the circuit. Reducing resistance in both the bidirectional switch 160 and the inductor 150 lessens the rate of decay and therefore keeps this work to a minimum.

As will now be described with reference to FIG. 7, the inventors have found that minimising the capacitance of the bidirectional switch 160 is important for reducing the energy consumption of the switching circuit 101 shown in FIG. 4.

Figure 7:
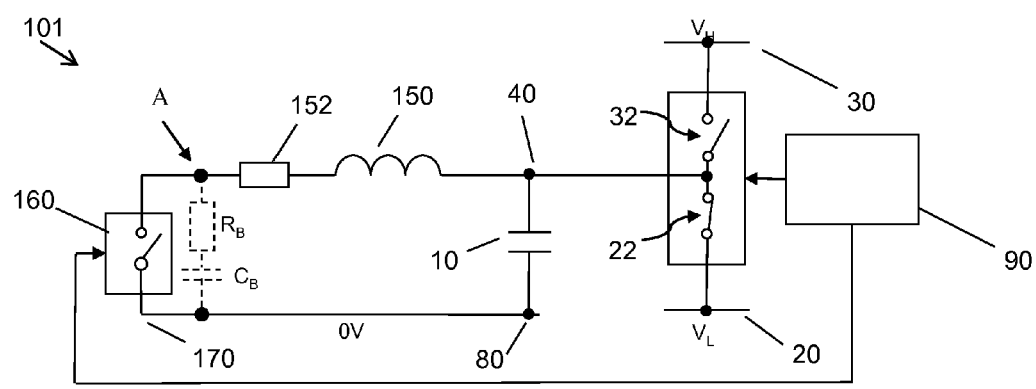
FIG. 7 shows the switching circuit of FIG. 4 when the bidirectional switch is open.

FIG. 7 shows the switching circuit 101 of FIG. 4 when the bidirectional switch 160 is open.

If we assume that the bidirectional switch 160 is an ideal switch then, when it is open, there would not be any current flowing in the inductor and therefore the only current to flow in the voltage rail switches would be to "top-up" the load capacitor 10. However, in reality the switch 160 will not be ideal and will have parasitic components as depicted in FIG. 7. These form a secondary resonant loop in series with the load capacitance 10 ($C_L$) and inductor 150. Alternating current now flows through the inductor fed initially from the load capacitance 10. The voltage rail switches 22, 32 work to maintain the DC voltage on the load and therefore continue to supply top-up current to the load. The value of the parasitic capacitance $C_B$ determines the amplitude of this current. As a consequence of the current flowing from a voltage rail connected to the output node 40, power is dissipated in the secondary loop. Since power is proportional to the square of the current which itself is proportional to the square root of capacitance we can see that power dissipation is directly proportional to total capacitance. This loss of power may be viewed as a key to understanding an advantage provided by the present invention, in that the proposed configuration of the bidirectional switch 160 offers a significant (measured as a fourfold improvement) advantage over any other known methods adopted in such an energy recovery process.

In addition, this flow of current in and out of the load capacitance causes voltage ripple at the load, where the amplitude will be in proportion to the ratio of $C_B$ to $C_L$ and the frequency will be inversely proportional to the total capacitance of $C_B$ in series with $C_L$.

If we assume that $C_L \gg C_B$ then the total capacitance can be approximated to $C_B$, since the capacitances $C_L$ and $C_B$ are connected in series with the bidirectional switch 160 open. Thus minimising $C_B$ will reduce voltage ripple at the load and will minimise power dissipation.

Figure 8:
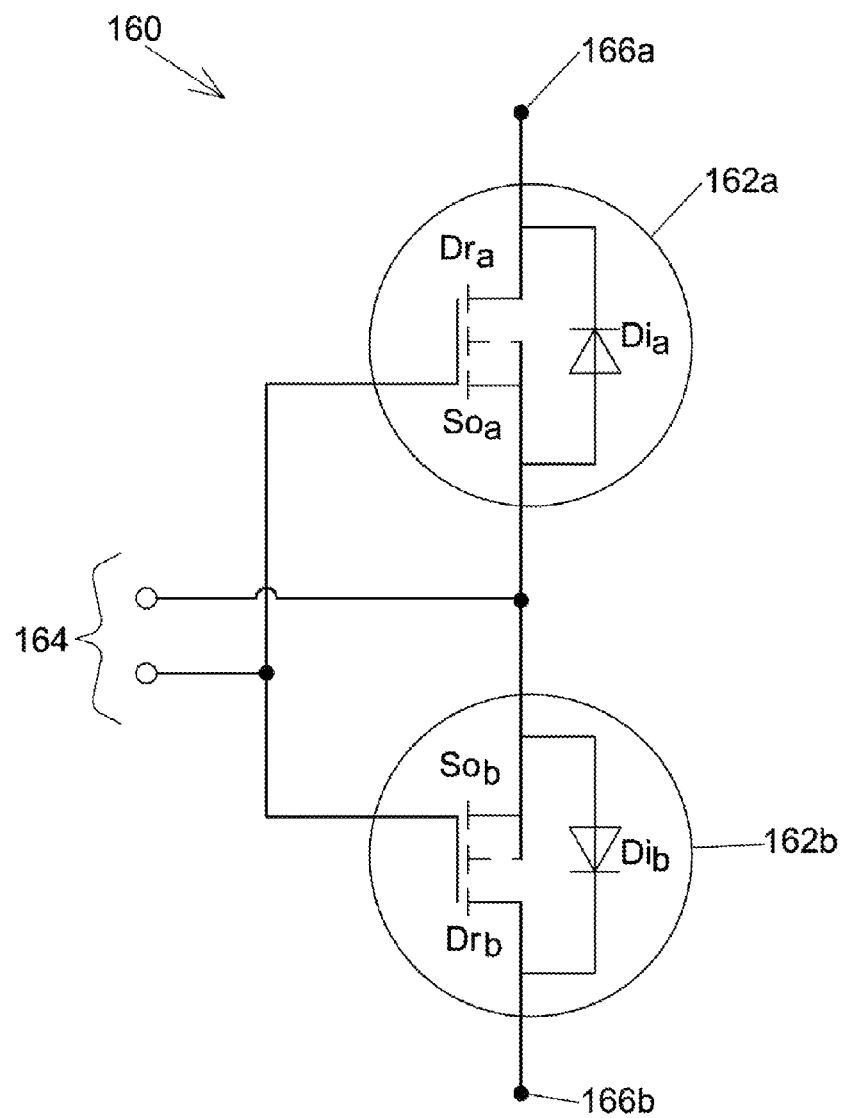
FIG. 8 shows a preferred bidirectional switch for use in the switching circuit 101 of FIG. 4.

FIG. 8 shows a preferred bidirectional switch 160 for use in the switching circuit 101 of FIG. 4.

The bidirectional switch includes an input 164 and two contacts 166a, 166b and is configured to allow a current to flow between the two contacts when a differential voltage equal to or greater than a threshold is applied to the input 164, yet substantially prevent a current flowing between the two contacts when a differential voltage less than a threshold is applied to the input 164.

The bidirectional switch 160 shown in FIG. 8 includes two MOSFET transistors 162a, 162b connected in series back-to-back in this case with the source $SO_a$ of the first MOSFET transistor 162a being connected to the source $SO_a$ of the second MOSFET transistor 162b.

As is known in the art, a transistor is normally associated with a direction of conventional current flow between two of its nodes. For the MOSFET transistors 162a, 162b shown in FIG. 8, this direction runs from the drain ($Dr_a$, $Dr_b$) to the source ($So_a$, $So_b$).

A particular advantage of using MOSFETs is that each MOSFET, by virtue of its structure, includes a body diode, drawn with dashed lines FIG. 8 as $Di_a$, $Di_b$. The body diode of a MOSFET points in a direction opposite to the direction of conventional current flow.

By connecting the two MOSFETs 162a, 162b back-to-back, e.g. as shown in FIG. 8, the bidirectional switch 160 is able to allow a current to flow in either direction between the two contacts 166a, 166b when a differential voltage equal to or greater than a threshold is applied to the input 164 (this threshold being determined by the voltage needed to turn on the two MOSFETs 162a, 162b).

In detail, when a differential voltage equal to or greater than a threshold is applied to the input 164, a current is able to flow from the first contact 166a to the second contact 166b via the drain $Dr_a$ and source $So_a$ of the first MOSFET 162a and via the body diode $Di_b$ of the second MOSFET.

Similarly, when a differential voltage equal to or greater than a threshold is applied to the input 164, a current is able to flow from the second contact 166b to the first contact 166a via the drain $Dr_b$ and source $So_b$ of the second MOSFET 162b and via the body diode $Di_a$ of the first MOSFET 162a.

However, when a differential voltage less than the threshold is applied to the input 164, a current is substantially prevented from flowing between the contacts 166a, 166b by the body diodes $Di_a$, $Di_b$.

A particular advantage of the bidirectional switch 160 shown in FIG. 8 is that it has a very low capacitance, because the two MOSFET transistors 162a, 162b are connected in series.

In detail, if the capacitance of the first MOSFET 162a is $C_{Ma}$, and the capacitance of the second MOSFET 162b is $C_{Mb}$, then the capacitance of the bidirectional switch $C_B$ (neglecting other capacitances) will be given by:

$$\frac{1}{C_B} = \frac{1}{C_{Ma}} + \frac{1}{C_{Mb}} \qquad [8]$$

If the two MOSFETs 162a, 162b are assumed to have the same capacitance $C_M$, then:

$$C_B = \frac{C_M}{2} \qquad [9]$$

That is, the capacitance of the bidirectional switch 160 is half that that of the individual MOSFETs. This improves the efficiency of the switching circuit 101 for reasons previously explained in relation to FIG. 7 above.

Of course, a similar bidirectional switch to that shown in FIG. 8 could be constructed from either npn or pnp transistors using two such transistors connected back-to-back. The difference here would be that additional diodes would need to be incorporated into the bidirectional switch to act in a similar way to the body diodes $Di_a$, $Di_b$, since npn/pnp transistors do not include such diodes by virtue of their structure.

Other bidirectional switches could equally be constructed.

The inventors have found that, given careful management of other factors which might contribute to reduction of the efficiency (for example, switch timing) together with a carefully chosen inductance, minimisation of the parasitic capacitance of the bidirectional switch 160 and minimisation of the total resistance of the switching circuit, the switching circuit 101 shown in FIG. 4 is able to provide significant gains in efficiency compared to the switching circuit 1 shown in FIG. 2. Indeed, in the experience of the authors, the power consumption for a specific voltage waveform can be reduced to less than 10% of that compared to the direct switching circuit geometry shown in FIG. 2. Further, this improvement in efficiency can be achieved whilst retaining the ability to set a broad range of frequencies and change the frequency and voltage of the waveform. No other known form of energy recovery in the prior art uses a bidirectional switch in this way. Instead two unidirectional switches are usually employed and as such are effectively connected in parallel.

This results in a parasitic capacitance four times larger than the series connected bidirectional switch. Consequently, the power losses are proportionally larger.

Figure 9:
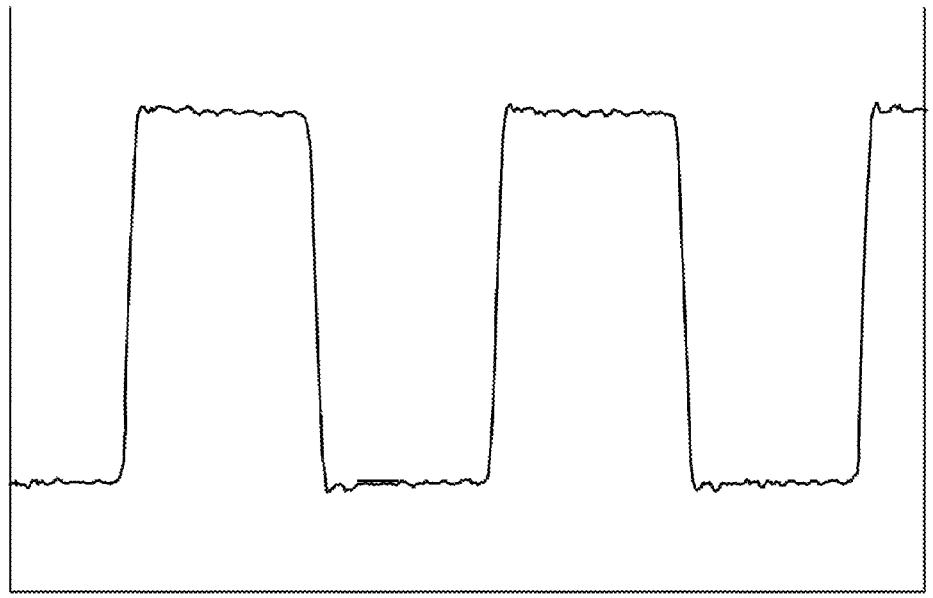
FIG. 9 shows a voltage waveform generated by an apparatus as disclosed in RU2010392 during experimental work carried out by the inventors.
Figure 10:
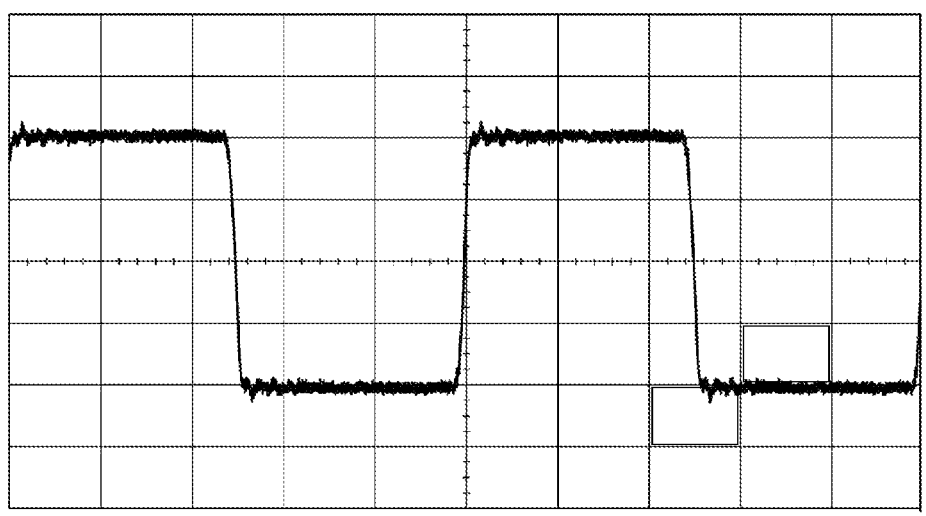
FIG. 10 shows a voltage waveform generated by the switching circuit of FIG. 4 during experimental work carried out by the inventors.

Experimental evaluation of the current invention has been performed and compared to the prior art as disclosed in RU2010392. The voltage waveform generated by an apparatus as disclosed in RU2010392 is shown in FIG. 9. A waveform generated by the switching circuit 101 of FIG. 4 is shown in FIG. 10. As can be seen from these plots, the switching circuit 101 of FIG. 4 generates a better shaped output when compared with the prior art as disclosed in RU2010392. For instance the top of the waveform is flatter with lower ripple. This is believed to be, at least in part, a consequence of the low capacitance of the bidirectional switch 160 used in the switching circuit 101 of FIG. 4. As discussed above, a problem with any capacitance at the bidirectional switch 160 is that it resonates with the inductor 150 when the bidirectional switch 160 is open and the resultant large amplitude sine wave at the top of the bidirectional switch 160 can transfer through to the inductor 150 to the output node 140 manifesting itself as ripple on the output node 140. Such impaired voltage waveform shape will, in general, always manifest itself when using a switching method as described in the prior art RU2010392. This represents an improved feature of the switching circuit 101 of FIG. 4 over RU2010392.

The switching circuit 101 of FIG. 4 also shows an improvement in power consumption compared with the switching circuits disclosed in other prior art documents. For example, experimental measurements have shown that the switching circuit 101 of FIG. 4 can reduce power consumption by more than six times over the "hard switching" approach employed in WO01/29875. Without wishing to be bound by theory, the present inventors believe that this reduction in power consumption is achieved because the resonant circuit employed in the switching circuit 101 of FIG. 4 is arranged such that the inductor 150 (rather than the power supply) provides most of the current required for the load capacitance 110 to change its voltage. Due to the relationship between applied voltage and power, the current embodiment allows operation at increased applied voltage when compared to the prior art.

The switching circuit 101 of FIG. 4 might be employed with a frequency preferably between 10 kHz and 100 MHz, more preferably 100 kHz and 10 MHz and most preferably between 500 kHz and 5 MHz. The switching circuit 101 of FIG. 4 might be employed with voltage rails whose voltage has a magnitude of preferably between 10 V and 5,000 V, more preferably 50 V and 2, 500 V and most preferably between 100 V and 1,000 V. However, the skilled observer will recognise that these limitations are largely determined by current transistor technology, and do not represent a fundamental limitation of the invention.

The switching circuit 101 of FIG. 4 is preferably controlled by the control unit 90 such that the frequency can be controlled by digital electronics and changed arbitrarily.

The switching circuit 101 of FIG. 4 confers several advantages over the prior art. For example, the employment of a low capacitance bidirectional switch 160 configured from MOSFETs allows a considerable reduction in power consumption over the prior art. This leads to improved robustness as well as improved energy efficiency. Further, the employment of the bidirectional switch in a half-bridge configuration allows a cleaner waveform without ringing than described by some prior art documents such as RU2010392.

Figure 11:
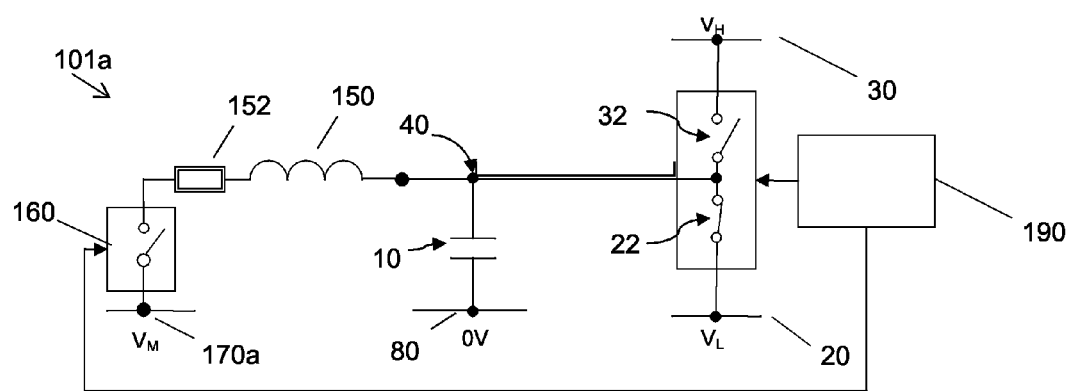
FIG. 11 is a schematic showing an alternative switching circuit, which is a modified version of the switching circuit shown in FIG. 4.

FIG. 11 shows another switching circuit 101a, which is the same as the switching circuit 101 except that the anchor node 170a in the switching circuit 101a has a voltage $V_M$, which is not necessarily equal to 0V. For example, in the circuit 101a of FIG. 11, $V_M$, $V_L$ and $V_H$ could be set such that $V_M$ is equal to a non-zero voltage that is the point midway between $V_L$ and $V_H$ (i.e. the average of $V_L$ and $V_H$), so that the full waveform is offset from 0V by $V_M$. In this case, a third power supply may be required to maintain the midpoint potential at the non-zero value $V_M$.

Note that the circuit 101 shown in FIG. 4 is effectively a special case of the circuit 101a shown in FIG. 11, in which $V_M$ is 0V. However, it must be considered that in the case of driving an ion trap then the load capacitance 10 will in general always be to ground unless the vacuum chamber or a chamber or electrodes surrounding the trap is floated at a different voltage. So the load capacitance will, in general always be connected to ground potential in this application of the invention, whereas $V_L$, $V_H$ and $V_M$ can potentially be selected to have any desired value by connection to a suitable voltage supply.

The switching circuit 101a shown in FIG. 11 may of course have any of the features described above in relation to the switching circuit 101 shown in FIG. 4, except where this is impossible or expressly avoided.

Figure 12:
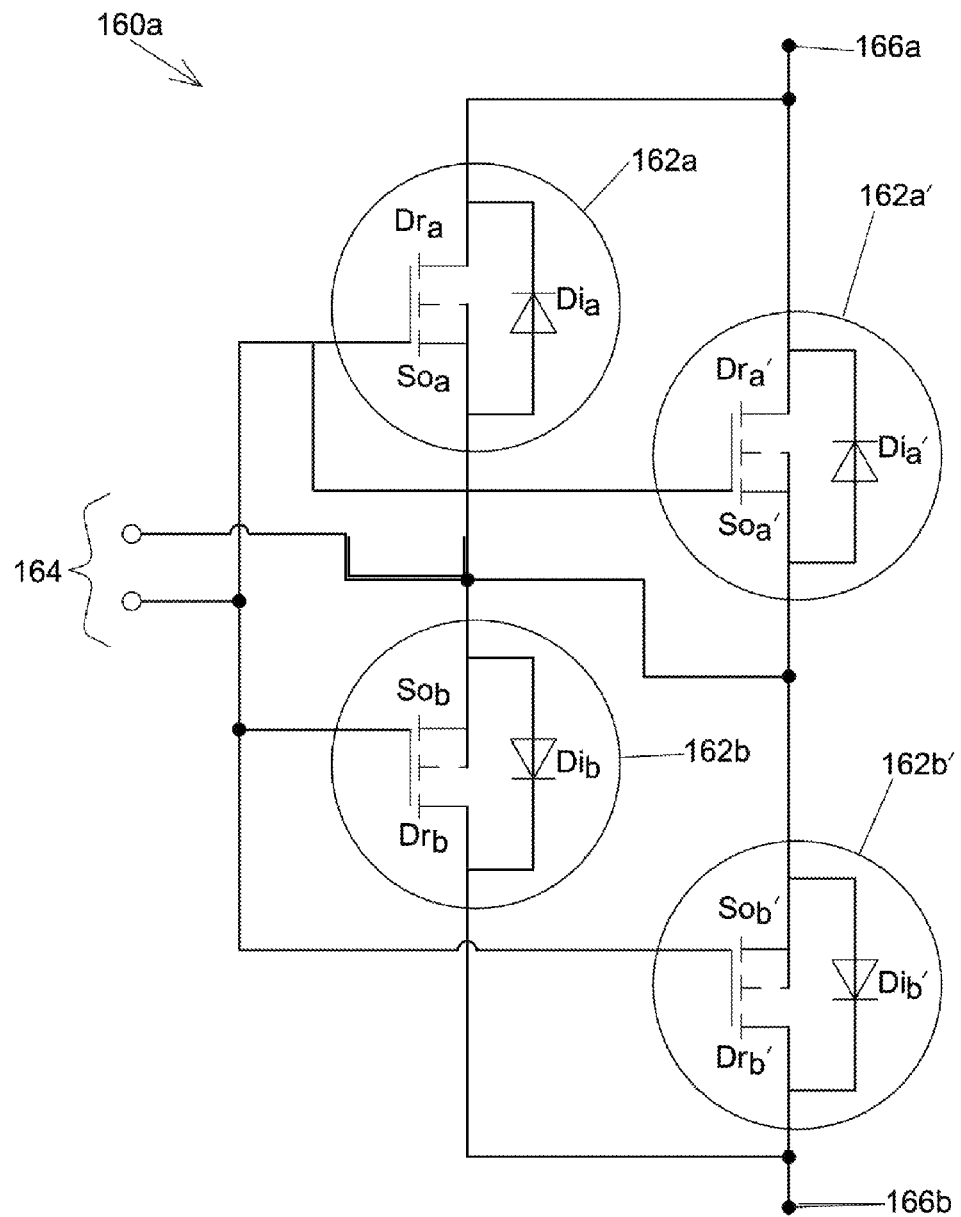
FIG. 12 shows an alternative bidirectional switch for use in the switching circuit 101 of FIG. 4 or FIG. 11.

FIG. 12 is an alternative bidirectional switch 160a for use in the switching circuits 101, 201 of FIG. 4 and FIG. 11. This switch includes the series back-to-back MOSFETs of FIG. 8. Also included are two further MOSFETs, 162a' and 162b', which are connected in parallel with MOSFETS 162a and 162b respectively. This configuration is not preferred, as the additional capacitance due to the parallel capacitors impedes efficient operation of the switching circuits 101 and 201. However, in some cases, it might be preferable to sacrifice some performance with respect to energy efficiency in order to gain additional current capacity for the bidirectional switch.

One Rail Half-Bridge Switching Circuit (with Energy Recovery)

The switching circuits 101, 101a of FIG. 4 and FIG. 11 rapidly switch between two power supply rails using the rising edge of a resonant circuit. However, alternative configurations of this circuit can be envisaged.

Figure 13:
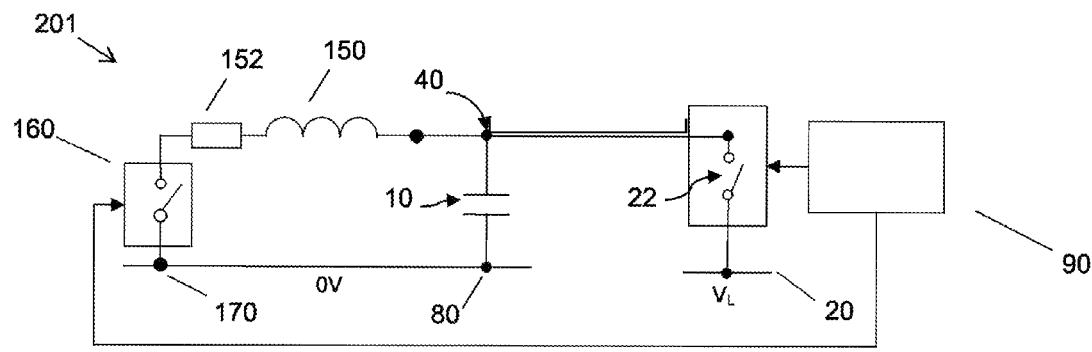
FIG. 13 is a schematic showing an example of a one-rail half-bridge switching circuit with energy recovery.

One alternative configuration is shown in FIG. 13, which shows a one-rail (or "asymmetric") half-bridge switching circuit 201 with energy recovery.

The switching circuit 201 shown in FIG. 13 is the same as the switching circuit 101 of FIG. 4, except that the second voltage rail 30 and associated circuitry are omitted. That is, the switching circuit 201 of FIG. 13 has only one voltage rail 20 and only one voltage rail switch 22, as shown in FIG. 13.

The switching circuit 201 shown in FIG. 13 may of course have any of the features described above in relation to the switching circuits 101, 101a shown in FIG. 4 and FIG. 11, except where this is impossible or expressly avoided.

As in the switching circuits 101, 101a of FIG. 4 and FIG. 11, it should be clear to those skilled in the art that the bidirectional switch 160 as shown in FIG. 13 can be placed on either side of the inductor 150.

The "one rail" switching circuit 301 of FIG. 13 allows the possibility of at least two related, but different control methods.

For example, the control unit 90 of the switching circuit 201 of FIG. 13 may be configured to control the switching circuit 201 to operate according to a first control method including:
  a) Opening the bidirectional switch 160 and closing the voltage rail switch 22 so that the output node 40 is clamped at the voltage of the (only) voltage rail 20. As a consequence, the load capacitor 10 charges to $V_L$.

b) Causing the voltage at the output node 40 to swing away from and back towards the voltage of the voltage rail 20 by opening the (only) voltage rail switch 22 and closing the bidirectional switch 160 so that a resonant circuit is established between the inductor 150 and the load capacitance 10, preferably for a time equal to the period of the main resonant frequency. In more detail, the voltage at the output node 40 will swing close to $V_H$ (but not quite all the way, due to damping) before swinging back down towards $V_L$.

c) The sequence is then repeated, starting again at (a).

Figure 14:
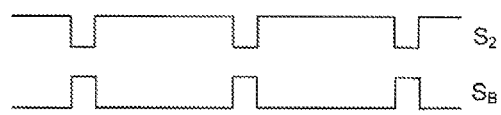
FIG. 14 shows (a) a first example switch timing sequence and (b) an example voltage waveform produced using this switch timing sequence for the switching circuit shown in FIG. 13.
Figure 14:
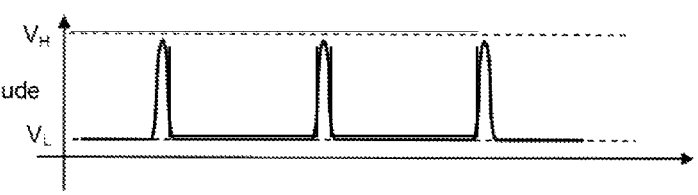

The first control method can be used to generate waveforms of the type shown in FIG. 14. Also shown in FIG. 14 is a suitable switch timing sequence which might be used to produce such a voltage waveform.

It can be seen that, in this control method, the voltage at the output node 40 will never reach what is referred to as $V_H$, but will fall short by a value determined by the damping of the resonant circuit (which is in turn determined by the resistance 152 of the switching circuit 201).

Those skilled in the art will recognise that the switching circuit 201 of FIG. 13 can equally be applied with $V_L$ as a positive or negative value, whereby the potential measured at point M can take the form of positive-going or negative going pulses. In either case, the approximate midpoint of the pulse is determined by 0 V (or ground potential).

Further embodiments also exist, whereby a second power supply can be used to apply a potential to the rail labelled 0 V, whereupon the waveform shape will change appropriately.

Figure 16:
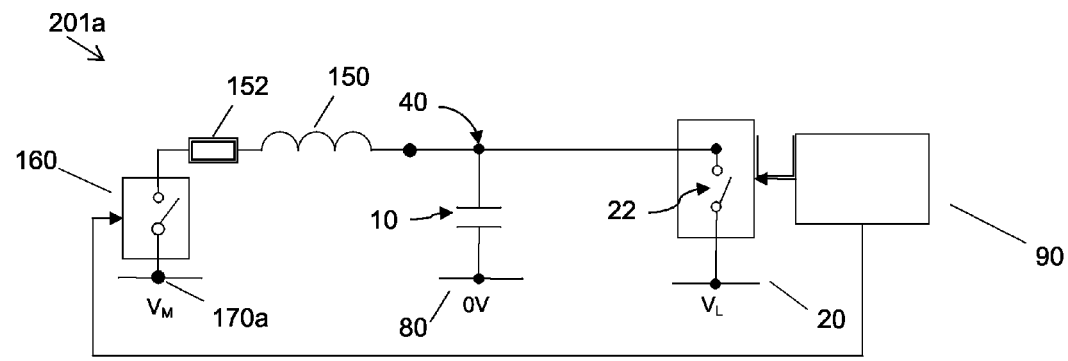
FIG. 16 is a schematic showing an alternative switching circuit, which is a modified version of the switching circuit shown in FIG. 13.

Indeed, yet further embodiments can be imagined whereby a voltage supply is connected to the anchor node 170, with the voltage rail 20 being connected instead to ground (see e.g. FIG. 16).

Observe also that the frequency of the pulse can be changed without affecting the resonant rising/falling edge. Indeed, the frequency can be increased by shortening the delay between switching such that the flat portion of the waveform during which time the output node 40 is held at $V_L$ can be made vanishingly small. Equally, the flat portion of the rectangular voltage waveform can be increased in length, producing a lower frequency voltage waveform. The shape of the pulse is defined according to the characteristics of the resonant part of the circuit, and components can be chosen to tailor the shape of the pulse according to the desired characteristics.

As another example, the control unit 90 of the switching circuit 201 may be configured to control the switching circuit 201 to operate according to a second control method including:

a) Opening the bidirectional switch 160 and closing the voltage rail switch 22 so that the output node 40 is clamped at the voltage of the voltage rail 20. As a consequence, the load capacitor 10 charges to $V_L$.

b) Causing the voltage at the output node 40 to swing towards a floating voltage by opening the voltage rail switch 22 and closing the bidirectional switch 160 so that a resonant circuit is established between the inductor 150 and the load capacitance 10, preferably for a time equal to one half of the period of the main resonant frequency. As a consequence, the voltage at the output node swings close to $V_H$ (but not quite all the way, due to damping).

c) Opening the bidirectional switch without closing the voltage rail switch so that the output node is held at the floating voltage, which is preferably at a value close to $V_H$.

d) Causing the voltage at the output node 40 to swing towards the voltage of the voltage rail 20 by closing the bidirectional switch 160 so that a resonant circuit is established between the inductor 150 and the load capacitance 10. As a consequence, the voltage at the output node 40 falls close to $V_L$.

e) The sequence is then repeated, starting again at (a).

Figure 15:
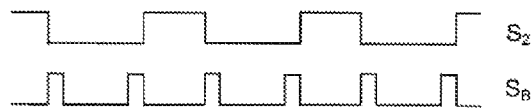
FIG. 15 shows (a) a second example switch timing sequence and (b) an example voltage waveform produced using this switch timing sequence for the switching circuit shown in FIG. 13.
Figure 15:
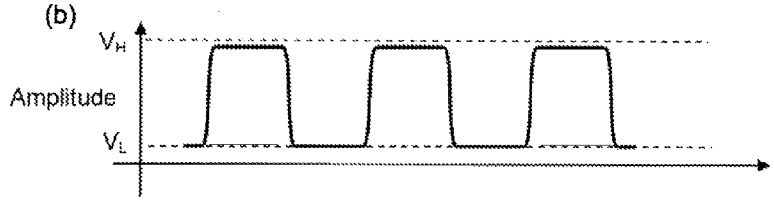

This second control method can be used to generate waveforms of the type shown in FIG. 15. Also shown in FIG. 15 is a suitable switch timing sequence which might be used to produce such a voltage waveform. In this control method, the voltage as measured at the output node 40 may be held at the floating voltage (close to $V_H$) for an arbitrary period, leading to a rectangular waveform.

FIG. 16 shows another switching circuit 201a, which is the same as the switching circuit 201 except that the anchor node 170a in the switching circuit 201a has a voltage $V_M$, which is not necessarily equal to 0V. For example, in the circuit 201a of FIG. 16, $V_L$ and $V_H$ could be set such that $V_M$ is equal to a non-zero voltage that is the point midway between $V_L$ and $V_H$ (i.e. the average of $V_L$ and $V_H$). In this case, the full waveform can be offset in either the positive or negative direction as required. In this case, a third power supply may be required to maintain the midpoint potential at a value other than 0 V.

Full-Bridge Switching Circuits

All previous discussion has described "half-bridge" switching circuits, wherein a single (e.g. RF) voltage waveform is generated and applied to a set of electrodes.

Figure 17:
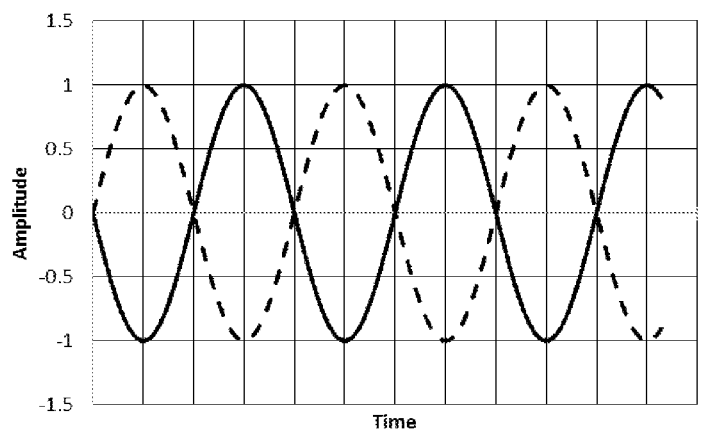
FIG. 17 shows a pair of antiphase sinusoidal waveforms produced by a resonant circuit.
Figure 18:
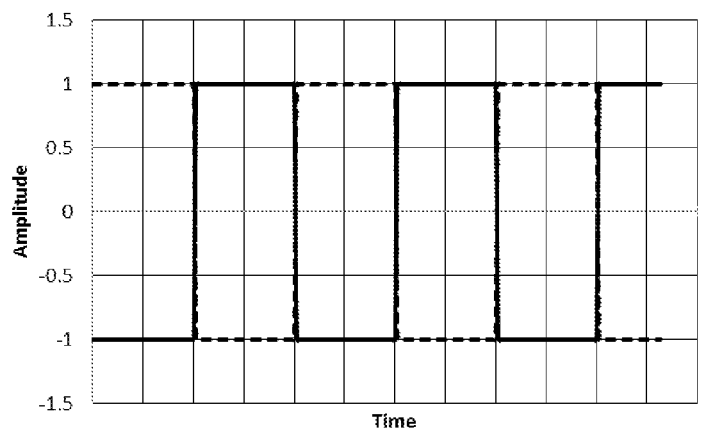
FIG. 18 shows a pair of antiphase rectangular waveforms produced by a digital switching circuit.

However, a "full-bridge" arrangement may also be employed, wherein two antiphase voltage waveforms are generated and preferably applied to opposing electrodes of the same load capacitance. This is common in, for example, linear ion trap mass spectrometers, or any other mass spectrometer employing linear quadrupole rods. For example, one phase might be applied to the electrodes disposed in an X plane and the other phase applied to electrodes disposed in a Y plane. Such a pair of antiphase waveforms (as produced, in this case, by a resonant circuit) are shown in FIG. 17. A digital direct switching equivalent is shown in FIG. 18.

For generation of two antiphase rectangular waveforms using a digital switching circuit, a "full-bridge" circuit may be used.

Figure 19:
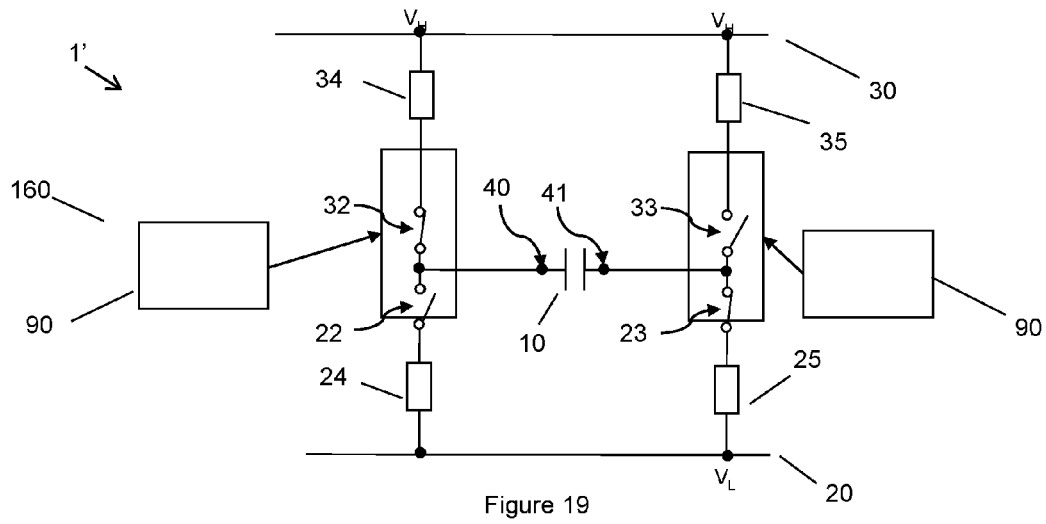
FIG. 19 is a schematic showing an example of a two-rail full-bridge separate inductor switching circuit for generating a high frequency switching voltage waveform by a direct switching method.

FIG. 19 shows a full-bridge switching circuit 1' which does not employ energy recovery.

The full-bridge switching 1' circuit of FIG. 19 is the same as the "half-bridge" switching circuit 1 shown in FIG. 2, except that it has preferably been modified to include an additional output node 41 with the load capacitance 10 connected between the output node 40 and the additional output node 41. Also, preferably the first voltage rail is connected to the additional output node 41 by an additional first voltage rail switch and the second voltage rail is connected to the additional output node by an additional second voltage rail switch.

The two pairs of switches 22, 32, 23, 33 in the full-bridge switching circuit 1' of FIG. 19 are preferably controlled by the control unit 90 (which is shown in FIG. 19 as including two separate modules) so as to operate the switches in pairs (diagonally opposite to one another) such that switches 22 and 33 are activated at the same time as one another, and such that switches 23 and 32 are activated at the same time as one another. By activating the pairs of switches alternately, rectangular voltage waveforms as depicted in FIG. 18 can be generated. In this case, one phase of the RF would be observed on the output node 40 on one side of the load capacitance 10 with the other phase observed on the additional output node 41 on the other side of the load capacitance 10. Note that during the flat periods of the voltage waveform, the capacitor is charged to $V_H$-$V_L$ or $V_L$-$V_H$ Both the "one rail" and "two rail" switching circuits with energy recovery described above can also be employed in a full-bridge circuit, although only "full-bridge" versions of the "two rail" switching circuit with energy recovery are shown herein, for brevity.

Figure 20:
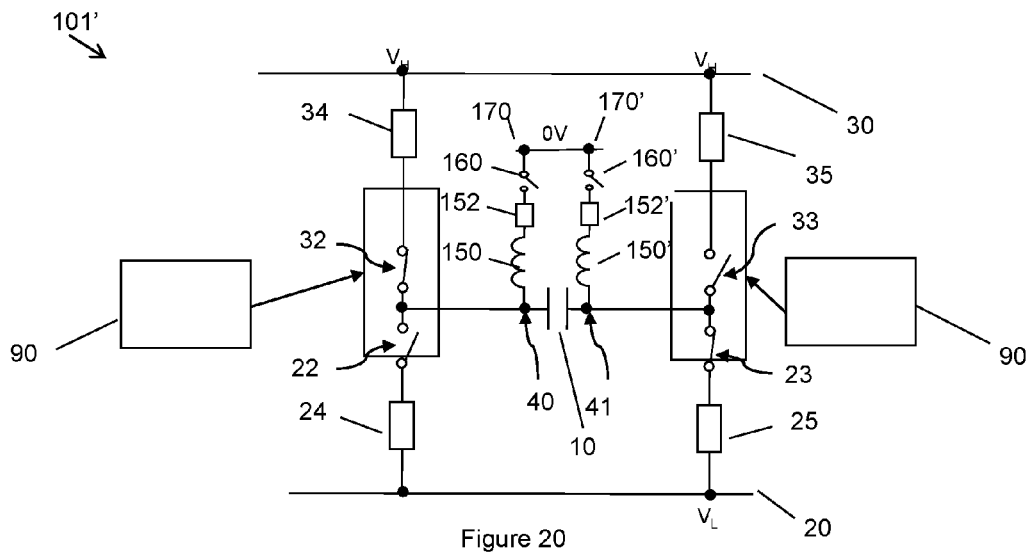
FIG. 20 is a schematic showing an example of a two-rail full-bridge separate inductor switching circuit with energy recovery.

FIG. 20 is an example of a two-rail full-bridge separate inductor switching circuit 101' with energy recovery.

Preferably, in the two rail full-bridge switching circuit 101' of FIG. 20, a first anchor node 170 is connected to the first output node 40 via a first inductor 150 and a first bidirectional switch 160, and a second anchor node 170' connected to the second output node 41 via a second inductor 150' and a second bidirectional switch 160', wherein the first and second anchor nodes 170, 170' and the first and second bidirectional switches 160, 160' are separate.

In this example, each half of the full-bridge switching circuit 101' is preferably operated in the same way as the half-bridge switching circuit 101 shown in FIG. 4, with the first bidirectional switch 160 being operated in sequence with the first and second voltage rail switches 22, 32 and with the second bidirectional switch being operated in sequence with the additional first and second voltage rail switches 23, 33.

Preferably, each half of the circuit 101' is operated in antiphase to the other half, i.e. such that the switches 22 and 33 are activated at the same time as one another, and such that switches 23 and 32 are activated at the same time as one another. Here it is to be noted that operating the two halves of the circuit 101' in antiphase means that the two bidirectional switches 160, 160' will each be operated at the same time.

Note that control unit 90 is shown in FIG. 20 as including two separate modules, but the control unit 90 may equally be provided in the form of a single module. Preferably, the control unit 90 is digital. Also note that the bidirectional switches 160, 160' are preferably controlled by the control unit 90, although a connection between these elements is not shown in FIG. 20 to avoid clutter.

Figure 21:
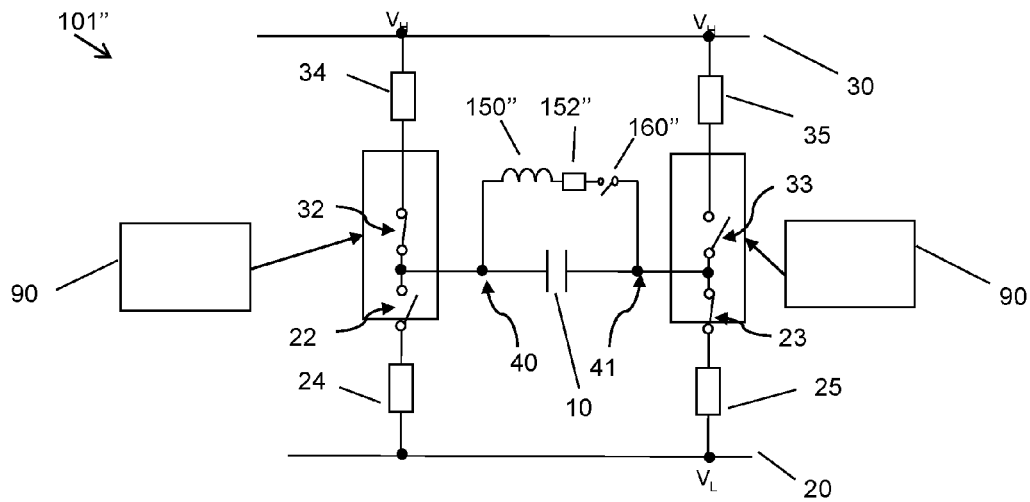
FIG. 21 is a schematic showing an example of a two-rail full-bridge shared inductor switching circuit with energy recovery.

FIG. 21 is an example of a two-rail full-bridge shared inductor switching circuit 101" with energy recovery.

The full-bridge switching circuit of FIG. 21 can be a more elegant circuit compared to that shown in FIG. 20, since in this case the first inductor 150 and second inductor 150' are preferably replaced by a single shared inductor 150", the first bidirectional switch 160 and the second bidirectional switch 160' are preferably replaced by a single bidirectional switch 160", the first output node 40 preferably acts as the second anchor node 170' and the second output node 41 preferably acts as the first anchor node 170.

In other words, the full-bridge switching circuit 101" of FIG. 21 preferably uses a single bidirectional switch and a single inductor connected between the two halves of the circuit. This arrangement is plausible because both bidirectional switches 160, 160' in the circuit 101' shown in FIG. 20 are switched simultaneously, and are effectively switching to a common point labeled 170 and 170' in FIG. 20.

Figure 24:
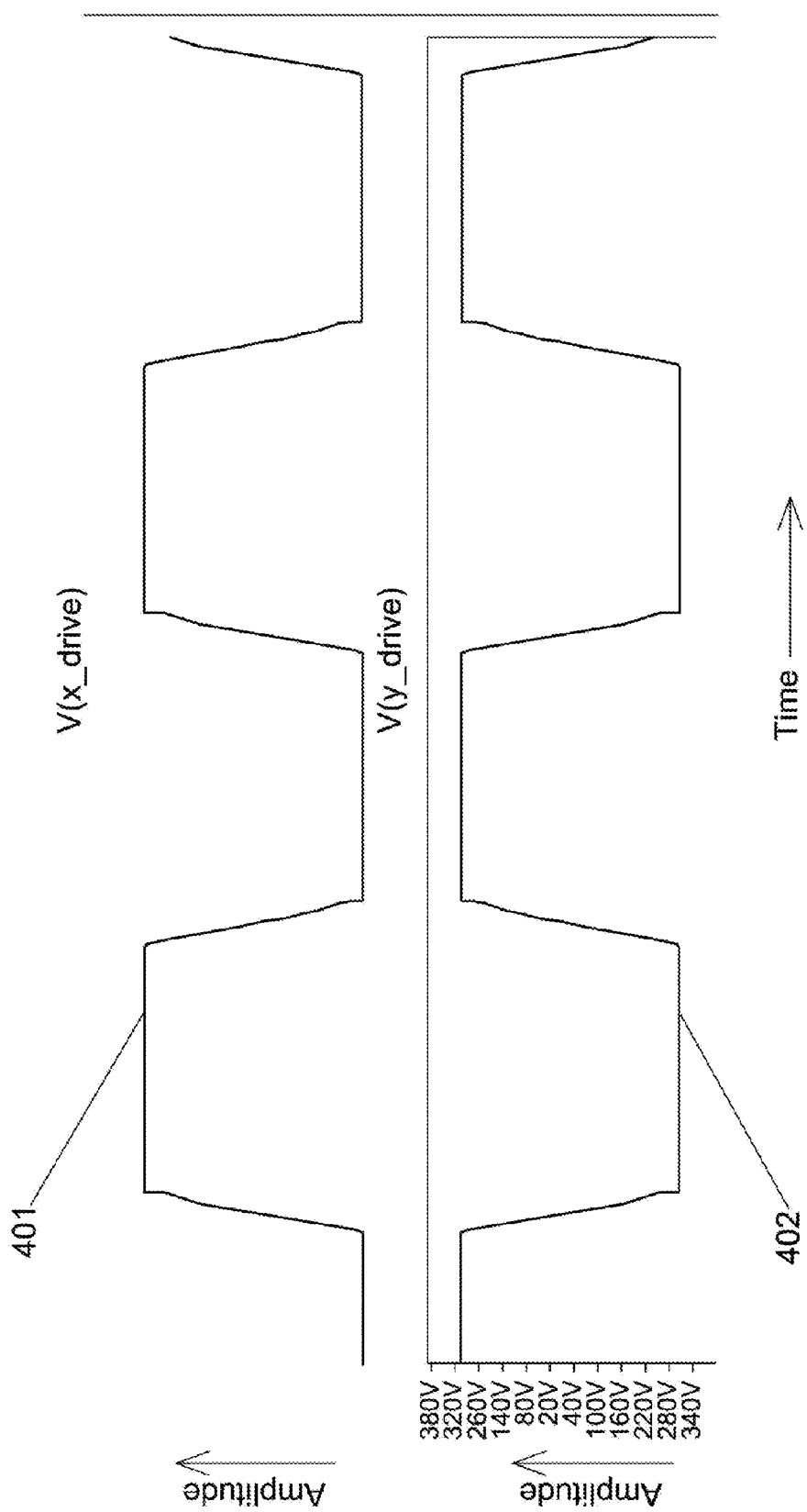
FIG. 24 shows a simulated pair of antiphase waveforms produced by a two rail full-bridge shared inductor switching circuit with energy recovery.

FIG. 24 shows two simulated waveforms such as might be generated by the full bridge switching circuit 101". The waveforms labelled 401 and 402 might be measured at points 40 and 41 of the circuits 101, 101' and 101".

Example switch timing sequences are not shown for the switching circuits of FIG. 19, FIG. 20 or FIG. 21, but example control methods for such arrangements have been discussed above.

The "full-bridge" switching circuits shown in FIG. 19, FIG. 20 or FIG. 21 may of course have any of the features described above in relation to the switching circuits described previously, except where this is impossible or expressly avoided.

Mass Spectrometry

A voltage waveform generated by one the switching circuits disclosed herein could be used to supply a radiofrequency (RF) or alternating current (AC) waveform, possibly for use in an apparatus for use in processing charged particles, e.g. for use in performing mass spectrometry. The voltage waveform generated could be described as largely rectangular in nature, although with sinusoidal, or resonant, switching edges. The frequency and amplitude of the waveform can be simply controlled by control of the power supplies connected to the voltage rails and by the control unit 90, which may include digital control circuitry.

One prior art application of digital square wave technology employed direct digital synthesis (DDS) methods to control the waveform. Such a method could equally be employed with the current invention.

The switching circuits with energy recovery described above may be particularly well suited to employment in an apparatus for use in performing mass spectrometry.

Figure 22:
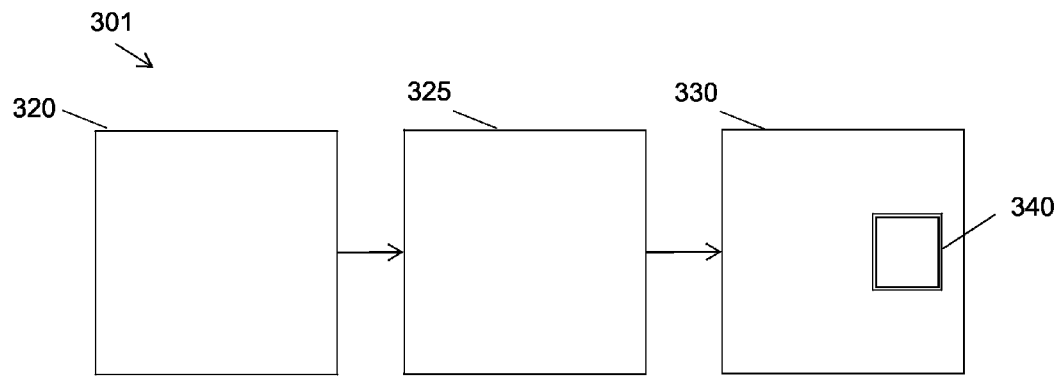
FIG. 22 is a schematic showing a mass spectrometer.

An example apparatus for use in performing mass spectrometry is a mass spectrometer 301 as shown in FIG. 22.

The mass spectrometer 301 includes an ion source 320 configured to produce ions; an ion processing means 325 configured to process ions; a mass analyser 330 configured to separate the ions according to their mass/charge ratio; and a detector 340 configured to detect the separated ions. The mass spectrometer 301 may of course include more than one detector 340.

The mass spectrometer 301 preferably includes a load capacitance to which an aforementioned output node 40 of an aforementioned circuit is connected so that, in use, the load capacitance receives a voltage waveform generated by the circuit.

Figure 23:
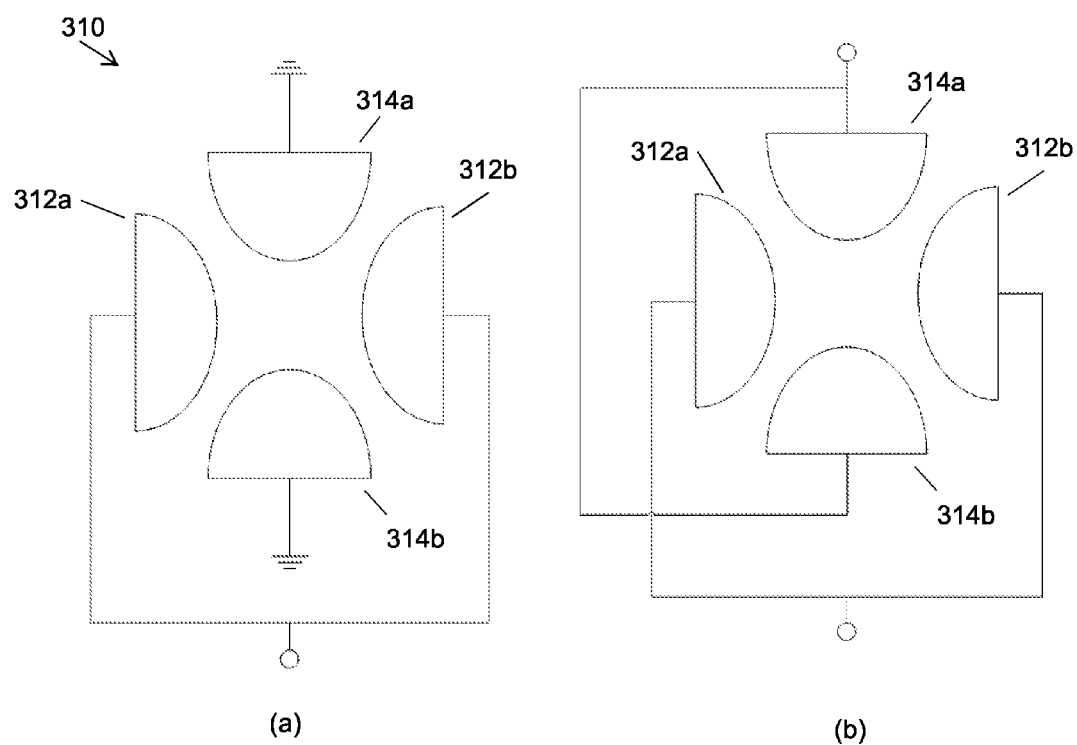
FIG. 23 shows two alternative configurations for a load capacitance suitable for use in a mass spectrometer.

FIG. 23 shows two alternative configurations for a load capacitance 310 suitable for use in a mass spectrometer, such as the mass spectrometer 301 of FIG. 22.

The load capacitance 310 of FIG. 23 preferably includes a first pair of (geometrically opposing) electrodes 312a, 312b and a second pair of (geometrically opposing) electrodes 314a, 314b.

The load capacitance electrodes are preferably disposed around an ion optical axis and might be configured as plates, rods or shaped electrodes. These electrodes could be shaped so as to present a hyperbolic shape when viewed in cross section.

Equally, when applied to other elements of mass spectrometer these electrodes might be disposed around the ion optical axis of a mass spectrometer such that there are more than four electrodes. One example could be in a multipole ion guide, where there might be two sets of three, four or more electrodes. Another example is in a stacked ring electrode device, wherein the electrodes themselves envelop the ion optical axis and are stacked along the ion optical axis.

The electrodes which form the load capacitance might be incorporated in several areas of a mass spectrometer such as in ion source interfaces, ion funnels, ion guides, multipoles quadrupoles, ion traps or any number of other ion processing devices employing the principle of electrodynamic ion containment. Preferably, an output node 40 of an aforementioned circuit is connected to the first pair of electrodes 312a, 312b so that, in use, the first pair of electrodes 312a, 312b receives a voltage waveform generated by the circuit.

In the configuration shown in FIG. 23(a), the second pair of electrodes 314a, 314b is preferably connected to ground. This electrode arrangement may be suitable for use with an aforementioned half-bridge circuit.

In the configuration shown in FIG. 23(b), an additional output node 41 of an aforementioned circuit is preferably connected to the second pair of electrodes 314a, 314b so that, in use, the second pair of electrodes 314a, 314b receives an additional voltage waveform generated by the circuit, wherein the additional voltage waveform is inverted (i.e. in antiphase) with respect to the voltage waveform. This electrode arrangement may be suitable for use with an aforementioned full-bridge circuit.

The mass spectrometer 301 may for example employ a mass-to-charge measurement means which does not rely on electrodynamics, but which might employ an ion processing device 325 such as that formed from electrodes as described. This ion processing device 325 may employ waveforms such as that generated using the current invention.

The mass spectrometer 301 may for example be a quadrupole mass spectrometer, a 3D ion trap mass spectrometer, or a linear ion trap mass spectrometer. Further, the mass spectrometer could, in addition, form part of a tandem mass spectrometer in combination with any of the above methods. Specific examples may include an ion trap—time of flight mass spectrometer, a linear ion—trap time of flight mass spectrometer or a triple quadrupole mass spectrometer.

A mass spectrometer that includes the switching circuits with energy recovery described above may provide the advantages of digitally driven "direct switching" mass spectrometers, such as the ability to scan frequency instead of voltage to generate a mass spectrum in certain types of mass analysers, the analysis of very high mass ions in certain types of mass spectrometers and high resolution & flexible precursor ion selection in some mass spectrometers (F. L. Brancia and L. Ding, "Rectangular waveform driven digital ion trap (DIT) mass spectrometer: theory and applications. In Practical Aspects of Trapped Ion Mass Spectrometry Volume IV—Theory and Instrumentation, Ed: R. E. March and J. F. J. Todd, CRC Press, London. pp—273-307).

The voltage waveform produced from the aforementioned switching circuits with energy recovery described above might also be employed in other ion optical devices, such as ion guides, ion funnels, collision cells and other ion optical elements to which radiofrequency waveforms are applied.

A voltage waveform generated by the aforementioned switching circuits with energy recovery may also be suited to employment in ion mobility devices such as field asymmetric ion mobility spectrometers, differential ion mobility spectrometers, ion mobility spectrometers etc.

In summary, the switching circuits with energy recovery described above may allow the generation of a radiofrequency (RF) or an alternating current (AC) voltage waveform at an easily controllable range of frequencies and voltages. Using Direct Digital Synthesis control may allow the frequency to be swept, jumped and changed quickly. This may be particularly advantageous when applied to a mass spectrometer where mass scans and isolation might be performed by scanning or changing the frequency of the drive waveform.

Further, the aforementioned switching circuits with energy recovery have been shown to reduce the amount of current drawn from power supply units, hence reducing power consumption. A secondary benefit of this reduced power is that there is a significant reduction in the level of cooling required, reducing the cost and complexity of the circuit. This lower power also reduces the risk of component failure due to thermal runaway. A further improvement is that the sinusoidal shape of the rising edge will reduce electromagnetic emissions. The versatility of the design means that several configurations are possible, where one, two or three power supply units can be used.

When used in this specification and claims, the terms "comprises" and "comprising", "including" and variations thereof mean that the specified features, steps or integers are included. The terms are not to be interpreted to exclude the possibility of other features, steps or integers being present.

The features disclosed in the foregoing description, or in the following claims, or in the accompanying drawings, expressed in their specific forms or in terms of a means for performing the disclosed function, or a method or process for obtaining the disclosed results, as appropriate, may, separately, or in any combination of such features, be utilised for realising the invention in diverse forms thereof.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

All references referred to above are hereby incorporated by reference.

The following statements provide general expressions of the disclosure herein.

A. A circuit for generating a voltage waveform at an output node, the circuit including: a voltage rail connected to the output node via a voltage rail switch;
an anchor node connected to the output node via an inductor and a bidirectional switch, wherein the bidirectional switch includes two or more transistors connected in series; and a control unit configured to change the voltage at the output node by controlling the voltage rail switch and the bidirectional switch so that, if a load capacitance is connected to the output node, a resonant circuit is established between the inductor and the load capacitance.

B. A circuit according to statement A, wherein the two or more transistors connected in series include a pair of MOSFET transistors connected back-to-back.

C. A circuit according to statement A or B, wherein the circuit is a switching circuit for generating a switching waveform that switches between a first voltage and a second voltage.

D. A circuit according to statement C, wherein the control unit is configured to change the frequency at which the switching voltage waveform switches between the first voltage and the second voltage.

E. A circuit according to any previous statement, wherein the circuit includes: a first voltage rail connected to the output node via a first voltage rail switch; a second voltage rail connected to the output node via a second voltage rail switch; wherein the control unit is configured to change the voltage at the output node by controlling the first voltage rail switch, the second voltage rail switch and the bidirectional switch so that, if a load capacitance is connected to the output node, a resonant circuit is established between the inductor and the load capacitance.

F. A circuit according to statement E, wherein the control unit of the circuit is configured to control the circuit to operate according to a control method including: opening the bidirectional switch and closing the first voltage rail switch so that the output node is clamped at the voltage of the first voltage rail; causing the voltage at the output node to swing towards the voltage of the second voltage rail by opening the first voltage rail switch and closing the bidirectional switch so that a resonant circuit is established between the inductor and the load capacitance; opening the bidirectional switch and closing the second voltage rail switch so that the output node is clamped at the voltage of the second voltage rail; causing the voltage at the output node to swing towards the voltage of the first voltage rail by opening the second voltage rail switch and closing the bidirectional switch so that a resonant circuit is established between the inductor and the load capacitance. The control method may include repeating these steps.

G. A circuit according to any one of statements A to D, wherein the control unit of the circuit is configured to control the circuit to operate according to a control method including: opening the bidirectional switch and closing the voltage rail switch so that the output node is clamped at the voltage of the voltage rail; causing the voltage at the output node to swing towards a floating voltage by opening the voltage rail switch and closing the bidirectional switch so that a resonant circuit is established between the inductor and the load capacitance; opening the bidirectional switch without closing the voltage rail switch so that the output node is held at the floating voltage; causing the voltage at the output node to swing towards the voltage of the voltage rail by closing the bidirectional switch so that a resonant circuit is established between the inductor and the load capacitance.

H. A circuit according to any one of statements A to D or statement G, wherein the control unit of the circuit is configured to control the circuit to operate according to a control method including: opening the bidirectional switch and closing the voltage rail switch so that the output node is clamped at the voltage of the voltage rail; causing the voltage at the output node to swing away from and back towards the voltage of the voltage rail by opening the first voltage rail switch and closing the bidirectional switch so that a resonant circuit is established between the inductor and the load capacitance.

I. A circuit according to any of the previous statements, wherein the circuit includes: a voltage rail connected to an output node via a voltage rail switch and connected to an additional output node via an additional voltage rail switch; a first anchor node connected to the output node via an inductor and a bidirectional switch that includes two or more transistors connected in series; a second anchor node connected to the additional output node via an inductor and a bidirectional switch that includes two or more transistors connected in series; wherein the control unit is configured to change the voltage at the output node by controlling the voltage rail switch and the bidirectional switch connected to the first anchor node so that, if a load capacitance is connected between the output node and the additional output node, a resonant circuit is established between the inductor connected to the first anchor node and the load capacitance; and wherein the control unit is configured to change the voltage at the additional output node by controlling the additional voltage rail switch and the bidirectional switch connected to the second anchor node so that, if a load capacitance is connected between the output node and the additional output node, a resonant circuit is established between the inductor connected to the second anchor node and the load capacitance.

J. A circuit according to statement I, wherein the circuit includes: a first voltage rail connected to the output node via a first voltage rail switch and connected to the additional output node via an additional first voltage rail switch; a second voltage rail connected to the output node via a second voltage rail switch and connected to the additional output node via an additional second voltage rail switch; a first anchor node connected to the output node via an inductor and a bidirectional switch that includes two or more transistors connected in series; a second anchor node connected to the additional output node via an inductor and a bidirectional switch that includes two or more transistors connected in series; wherein the control unit is configured to change the voltage at the output node by controlling the first voltage rail switch, the second voltage rail switch and the bidirectional switch connected to the first anchor node so that, if a load capacitance is connected between the output node and the additional output node, a resonant circuit is established between the inductor connected to the first anchor node and the load capacitance; and wherein the control unit is configured to change the voltage at the additional output node by controlling the additional first voltage rail switch, the additional second voltage rail switch and the bidirectional switch connected to the second anchor node so that, if a load capacitance is connected between the output node and the additional output node, a resonant circuit is established between the inductor connected to the second anchor node and the load capacitance.

K. A circuit according to statement I or J, wherein: the circuit includes a shared inductor, wherein the shared inductor acts as both the inductor connected to the first anchor node and the inductor connected to the second anchor node; the circuit includes a shared bidirectional switch, wherein the shared bidirectional switch acts as both the bidirectional switch connected to the first anchor node and the bidirectional switch connected to the second anchor node; the output node acts as the second anchor node; and the additional output node acts as the first anchor node.

L. A circuit according to statement I or J, wherein the circuit includes: separate inductors that act as the inductor connected to the first anchor node and the inductor connected to the second anchor node; separate bidirectional switches that act as the bidirectional switch connected to the first anchor node and the bidirectional switch connected to the second anchor node; first and second anchor nodes that are separate from the output node and additional output node.

M. An apparatus for use in processing charged particles, the apparatus including: a circuit according to any previous statement; a load capacitance to which the output node of the circuit is connected so that, in use, the load capacitance receives a voltage waveform generated by the circuit.

N. An apparatus according to statement M, wherein: the circuit includes an output node and an additional output node; the apparatus includes a load capacitance, wherein the load capacitance includes: at least one first electrode to which the output node of the circuit is connected so that, in use, the at least one first electrode receives a voltage waveform generated by the circuit; at least one second electrode to which the additional output node of the circuit is connected so that, in use, the at least one load capacitance receives an additional voltage waveform generated by the circuit.

O. A method of controlling a circuit according to any one of statements A to L to operate according to a control method as set out in statement F, statement G or statement H.

P. A computer-readable medium having computer-executable instructions configured to control a circuit according to any one of statements A to L to operate according to a control method as set out in statement F, statement G or statement H.

The invention claimed is:
1. A mass spectrometer including:
a circuit for generating a voltage waveform at an output node; and
a load capacitance to which the output node of the circuit is connected so that, in use, the load capacitance receives a voltage waveform generated by the circuit; wherein the circuit includes:
a first voltage rail connected to the output node via a first voltage rail switch;

a second voltage rail connected to the output node via second voltage rail switch;

an anchor node connected to the output node via an inductor and a bidirectional switch, wherein the bidirectional switch includes two or more transistors connected in series; and a control unit configured to change the voltage at the output node by controlling the first voltage rail switch, the second voltage rail switch, and the bidirectional switch so that a resonant circuit is established between the inductor and the load capacitance;

wherein the control unit of the circuit is configured to control the circuit to operate according to a control method including:

opening the bidirectional switch and closing the first voltage rail switch so that the output node is clamped at a voltage of the first voltage rail;

causing the voltage at the output node to swing towards the voltage of the second voltage rail by opening the first voltage rail switch and closing the bidirectional switch so that a resonant circuit is established between the inductor and the load capacitance;

opening the bidirectional switch and closing the second voltage rail switch so that the output node is clamped at a voltage of the second voltage rail; and causing the voltage at the output node to swing towards the voltage of the first voltage rail by opening the second voltage rail switch and closing the bidirectional switch so that a resonant circuit is established between the inductor and the load capacitance; and wherein the control unit is configured to change a frequency at which the switching voltage waveform switches between the voltage of the first voltage rail and the voltage of the second voltage rail.

2. A mass spectrometer according to claim 1, wherein the two or more transistors connected in series include a pair of MOSFET transistors connected back-to-back.

3. A mass spectrometer according to claim 1, wherein the circuit is a switching circuit for generating a switching waveform that switches between a first voltage and a second voltage.

4. A mass spectrometer according to claim 1, wherein the circuit includes:

an additional output node connected to the first voltage rail via an additional first voltage rail switch; and a second anchor node connected to the additional output node via an inductor and a bidirectional switch that includes two or more transistors connected in series;

wherein the control unit is configured to change the voltage at the output node by controlling the first voltage rail switch and the bidirectional switch connected to the first anchor node so that, if a load capacitance is connected between the output node and the additional output node, a resonant circuit is established between the inductor connected to the first anchor node and the load capacitance; and wherein the control unit is configured to change a voltage at the additional output node by controlling the additional first voltage rail switch and the bidirectional switch connected to the second anchor node so that, if a load capacitance is connected between the output node and the additional output node, a resonant circuit is established between the inductor connected to the second anchor node and the load capacitance.

5. A mass spectrometer according to claim 4 wherein the second voltage rail is connected to the additional output node via an additional second voltage rail switch;

wherein the control unit is configured to change the voltage at the output node by controlling the first voltage rail switch, the second voltage rail switch and the bidirectional switch connected to the first anchor node so that, if a load capacitance is connected between the output node and the additional output node, a resonant circuit is established between the inductor connected to the first anchor node and the load capacitance; and wherein the control unit is configured to change the voltage at the additional output node by controlling the additional first voltage rail switch, the additional second voltage rail switch and the bidirectional switch connected to the second anchor node so that, if a load capacitance is connected between the output node and the additional output node, a resonant circuit is established between the inductor connected to the second anchor node and the load capacitance.

6. A mass spectrometer circuit according to claim 4, wherein the circuit includes:

separate inductors that act as the inductor connected to the first anchor node and the inductor connected to the second anchor node;

separate bidirectional switches that act as the bidirectional switch connected to the first anchor node and the bidirectional switch connected to the second anchor node;

first and second anchor nodes that are separate from the output node and additional output node.

7. A mass spectrometer according to claim 4, wherein the load capacitance includes:

at least one first electrode to which the output node of the circuit is connected so that, in use, the at least one first electrode receives a voltage waveform generated by the circuit;

at least one second electrode to which the additional output node of the circuit is connected so that, in use, the at least one load capacitance receives an additional voltage waveform generated by the circuit.

8. A method of controlling a mass spectrometer, wherein the mass spectrometer includes a circuit for generating a voltage waveform at an output node and a load capacitance to which the output node of the circuit is connected so that, in use, the load capacitance receives a voltage waveform generated by the circuit, the circuit including:

a first voltage rail connected to the output node via a first voltage rail switch;

a second voltage rail connected to the output node via a second voltage rail switch;

an anchor node connected to the output node via an inductor and a bidirectional switch, wherein the bidirectional switch includes two or more transistors connected in series; and a control unit configured to change the voltage at the output node by controlling the first voltage rail switch, the second voltage rail switch, and the bidirectional switch so that, if a load capacitance is connected to the output node, a resonant circuit is established between the inductor and the load capacitance;

wherein the method includes a controlling the circuit to operate according to a control method that includes:

opening the bidirectional switch and closing the first voltage rail switch so that the output node is clamped at a voltage of the first voltage rail;

causing the voltage at the output node to swing towards a voltage of the second voltage rail by opening the first voltage rail switch and closing the bidirectional switch so that a resonant circuit is established between the inductor and the load capacitance;

opening the bidirectional switch and closing the second voltage rail switch so that the output node is clamped at the voltage of the second voltage rail; and causing the voltage at the output node to swing towards the voltage of the first voltage rail by opening the second voltage rail switch and closing the bidirectional switch so that a resonant circuit is established between the inductor and the load capacitance, wherein the method also includes changing a frequency at which the switching voltage waveform switches between the first voltage and the second voltage.

9. A computer-readable medium having computer-executable instructions configured to control a mass spectrometer, wherein the mass spectrometer includes a circuit for generating a voltage waveform at an output node and a load capacitance to which the output node of the circuit is connected so that, in use, the load capacitance receives a voltage waveform generated by the circuit, the circuit including:

a first voltage rail connected to the output node via a first voltage rail switch;

a second voltage rail connected to the output node via a second voltage rail switch;

an anchor node connected to the output node via an inductor and a bidirectional switch, wherein the bidirectional switch includes two or more transistors connected in series; and a control unit configured to change the voltage at the output node by controlling the first voltage rail switch, the second voltage rail switch, and the bidirectional switch so that, if a load capacitance is connected to the output node, a resonant circuit is established between the inductor and the load capacitance;

wherein the computer-executable instructions are configured to control the circuit to operate according to a control method that includes:

opening the bidirectional switch and closing the first voltage rail switch so that the output node is clamped at a voltage of a first voltage rail causing the voltage at the output node to swing towards a voltage of the second voltage rail by opening the first voltage rail switch and closing the bidirectional switch so that a resonant circuit is established between the inductor and the load capacitance;

opening the bidirectional switch and closing the second voltage rail switch so that the output node is clamped at the voltage of the second voltage rail; and causing the voltage at the output node to swing towards the voltage of the first voltage rail by opening the second voltage rail switch and closing the bidirectional switch so that a resonant circuit is established between the inductor and the load capacitance, wherein the computer-executable instructions are also configured to change a frequency at which the switching voltage waveform switches between the first voltage and the second voltage.

* * * * *